United States Patent
Jung

(10) Patent No.: US 11,731,388 B2
(45) Date of Patent: *Aug. 22, 2023

(54) DISPLAY APPARATUS AND METHOD OF MANUFACTURING THE SAME

(71) Applicant: SAMSUNG DISPLAY CO., LTD., Yongin-si (KR)

(72) Inventor: Jaehoon Jung, Yongin-si (KR)

(73) Assignee: SAMSUNG DISPLAY CO LTD, Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/523,995

(22) Filed: Nov. 11, 2021

(65) Prior Publication Data
US 2022/0305753 A1    Sep. 29, 2022

(30) Foreign Application Priority Data

Mar. 29, 2021    (KR) .......... 10-2021-0040504

(51) Int. Cl.
| | |
|---|---|
| B32B 27/40 | (2006.01) |
| B32B 3/02 | (2006.01) |
| B32B 27/28 | (2006.01) |
| B32B 27/36 | (2006.01) |
| B32B 37/10 | (2006.01) |
| B32B 38/10 | (2006.01) |
| B32B 38/00 | (2006.01) |

(52) U.S. Cl.
CPC .............. *B32B 3/02* (2013.01); *B32B 27/283* (2013.01); *B32B 27/36* (2013.01); *B32B 27/40* (2013.01); *B32B 37/10* (2013.01); *B32B 38/10* (2013.01); *B32B 38/105* (2013.01); *B32B 2250/04* (2013.01); *B32B 2307/546* (2013.01); *B32B 2457/20* (2013.01)

(58) Field of Classification Search
CPC .......... B32B 2250/04; B32B 2307/546; B32B 2457/20; B32B 27/283; B32B 27/36; B32B 27/40; B32B 3/02; B32B 37/10; B32B 38/10; B32B 38/105; H01L 27/3244; H01L 51/0096
See application file for complete search history.

(56) References Cited

U.S. PATENT DOCUMENTS

| | | |
|---|---|---|
| 2019/0333978 A1 | 10/2019 | Lee |
| 2020/0381648 A1 | 12/2020 | Mun et al. |
| 2020/0411796 A1 | 12/2020 | Kwon et al. |

FOREIGN PATENT DOCUMENTS

| | | |
|---|---|---|
| KR | 1020200105064 A | 9/2020 |
| KR | 1020200128259 A | 11/2020 |

*Primary Examiner* — Lawrence D Ferguson
(74) *Attorney, Agent, or Firm* — Cantor Colburn LLP

(57) ABSTRACT

A display apparatus includes: a display panel including a display area, a peripheral area, a bending area, and a pad area; and a lower protection layer arranged on a rear surface of the display panel and including a first portion and a second portion, where the first portion corresponds to the display area and the peripheral area, and the second portion corresponds to the pad area. The first portion of the lower protection layer includes a material different from a material of the second portion. The display area is configured to display an image, the peripheral area is outside the display area and does not display an image, the bending area is on one side of the peripheral area, and the pad area is spaced apart from the peripheral area with the bending area therebetween.

11 Claims, 27 Drawing Sheets

DISPLAY APPARATUS AND METHOD OF MANUFACTURING THE SAME

This application claims priority to Korean Patent Application No. 10-2021-0040504, filed on Mar. 29, 2021, and all the benefits accruing therefrom under 35 U.S.C. § 119, the content of which in its entirety is herein incorporated by reference.

BACKGROUND

1. Field

One or more embodiments relate to a display apparatus and a method of manufacturing the same.

2. Description of the Related Art

A mobile electronic apparatus is widely used. As the mobile electronic apparatus, not only a miniaturized electronic apparatus such as mobile phones, but also a tablet personal computer ("PC") has been widely used recently.

To support various functions, the mobile electronic apparatus includes a display apparatus to provide a user with visual information such as an image. Because parts driving the display apparatus have been miniaturized, the proportion of the display apparatus in an electronic apparatus gradually increases. In addition, as the display apparatus has become thinner and lighter, their range of use has been gradually extended. In addition, research and development have been carried out on reducing the area of a non-display area and increasing the area of a display area of the display apparatus.

SUMMARY

One or more embodiments include a display apparatus which may display an image even in lateral surfaces and/or corners and a method of manufacturing the display apparatus to reduce the area of a non-display area and increase the area of a display area. One or more embodiments include a display apparatus which may reduce defects that may occur while a display panel is attached to a window cover, and a method of manufacturing the display apparatus. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes: a display panel including a display area, a peripheral area, a bending area, and a pad area, where the display area is configured to display an image, the peripheral area is outside the display area and does not display an image, the bending area is on one side of the peripheral area, and the pad area is spaced apart from the peripheral area with the bending area therebetween; and a lower protection layer arranged on a rear surface of the display panel and including a first portion and a second portion, where the first portion corresponds to the display area and the peripheral area, and the second portion corresponds to the pad area. Here, the first portion of the lower protection layer includes a material different from that of the second portion.

A modulus of the first portion of the lower protection layer may be less than a modulus of the second portion.

The first portion of the lower protection layer may include poly dimethylsiloxane.

The first portion of the lower protection layer may include thermoplastic polyurethane.

A modulus of the first portion of the lower protection layer may exceed about 0 megapascals (MPa) and less than about 100 MPa.

The second portion of the lower protection layer may include polyethylene terephthalate.

The display apparatus may further include a display circuit board attached in the pad area of the display panel.

The display panel may be bent in the bending area such that the display area overlaps the pad area in a thickness direction of the display panel.

The display apparatus may further include a cover window arranged on a front surface of the display panel.

The display area of the display panel may include a flat front display area; a first side display area adjacent to a first edge of the front display area, where at least a portion of the first side display area is bent; and a second side display area adjacent to a second edge of the front display area crossing the first edge, where at least a portion of the second side display area is bent. The peripheral area of the display panel may include a corner area arranged at a corner side where the first edge meets the second edge of the front display area, and the corner area may be adjacent to the first side display area and the second side display area.

The display area of the display panel may further include: a flat front display area; a first side display area adjacent to a first edge of the front display area, where at least a portion of the first side display area is bent; a second side display area adjacent to a second edge of the front display area crossing the first edge of the front display area, where at least a portion of the second side display area is bent; and a corner display area arranged at a corner side where the first edge meets the second edge of the front display area The corner display area may be adjacent to the first side display area and the second side display area.

According to one or more embodiments, a method of manufacturing a display apparatus includes: preparing a display panel including a display area, a peripheral area, a bending area, and a pad area, where the peripheral area is outside the display area, the bending area is on one side of the peripheral area, and the pad area is apart from the peripheral area with the bending area therebetween; attaching a lower protection layer to a rear surface of the display panel, where the lower protection layer includes a first portion and a second portion, the first portion corresponds to the display area and the peripheral area, and the second portion corresponds to the pad area; attaching a guide film to a rear surface of the lower protection layer; applying tensile force to the guide film and transforming a shape of the display panel; attaching a cover window to a front surface of the display panel; and removing the guide film. A modulus of the first portion of the lower protection layer is less than a modulus of the second portion.

The first portion of the lower protection layer may include poly dimethylsiloxane or thermoplastic polyurethane.

A modulus of the first portion of the lower protection layer may be greater than about 0 MPa and less than about 100 MPa.

The second portion of the lower protection layer may include polyethylene terephthalate.

The guide film may have a modulus greater than a modulus of the first portion of the lower protection layer.

The guide film may include polyethylene terephthalate.

The guide film may include a central region, a first edge area connected to a first edge of the central region, and a second edge area of the central region connected to a second edge crossing the first edge of the central region.

The display area of the display panel may include a front display area; a first side display area connected to a first edge of the front display area; and a second side display area connected to a second edge of the front display area crossing the first edge of the front display area, and the peripheral area of the display panel may include a corner area arranged at a corner side where the first edge of the front display area meets the second edge of the front display area, and the corner area is adjacent to the first side display area and the second side display area.

With the guide film attached to the rear surface of the lower protection layer, the central region of the guide film may include a concave corner not to overlap the corner area of the display panel in a plan view.

The display area of the display panel may include a front display area, a first side display area connected to a first edge of the front display area, a second side display area connected to a second edge of the front display area crossing the first edge of the front display area, and a corner display area adjacent to the first side display area and the second side display area.

With the guide film attached to the rear surface of the lower protection layer, the central region of the guide film may include a concave corner not to overlap the corner display area of the display panel in a plan view.

The method may further include after the attaching of the lower protection layer to the rear surface of the display panel, attaching a display circuit board in the pad area of the front surface of the display panel.

These and/or other aspects will become apparent and more readily appreciated from the following description of the embodiments, the accompanying drawings, and claims.

These general and specific aspects may be implemented by using a system, a method, a computer program, or a combination of a certain system, method, and computer program.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
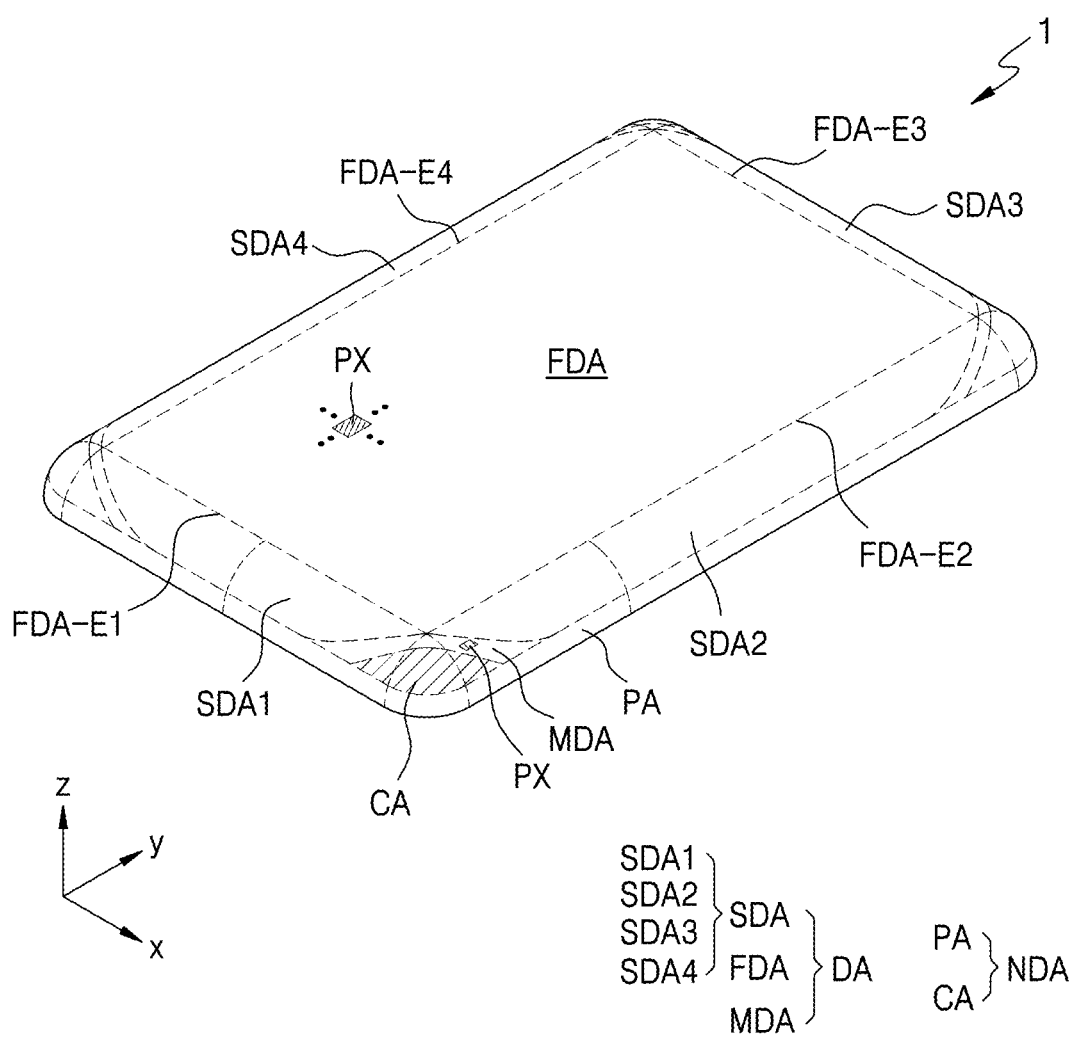
FIG. 1 is a perspective view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure according to the invention is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

In the present specification, "A and/or B" means A or B, or A and B. In the present specification, "at least one of A and B" means A or B, or A and B.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

In the following examples, the x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a perspective view of a display apparatus 1 according to an embodiment.

Referring to FIG. 1, the display apparatus 1 may be used as a display screen of various products including televisions, notebook computers, monitors, advertisement boards, Internet of things ("IoT") as well as portable electronic apparatuses including mobile phones, smart phones, tablet personal computers (PC), mobile communication terminals, electronic organizers, electronic books, portable multimedia players ("PMP"), navigations, and ultra mobile personal computers ("UMPC").

In an embodiment, the display apparatus 1 may have a quadrangular shape in a plan view. As an embodiment, the display apparatus) may have various shapes such as polygons including triangles and quadrangles, circular shapes, and elliptical shapes. In an embodiment, in the case where the display apparatus 1 has a polygonal shape in a plan view, the corners of the polygon may be round. Hereinafter, for convenience of description, the case where the display apparatus 1 has a quadrangular shape including round corners in a plan view is mainly described.

The display apparatus 1 may have short sides in a first direction (e.g., an x-direction or a (−) x-direction) and long sides in a second direction (e.g. a y-direction or a (−) y-direction). In another embodiment, in the display apparatus 1, the length of the side in the first direction (e.g., the x-direction or the (−) x-direction) may be the same as the length of the side in the second direction (e.g. the y-direction or the (−) y-direction). In another embodiment, the display apparatus 1 may have long sides in the first direction (e.g., the x-direction or the (−) x-direction) and short sides in the second direction (e.g. the y-direction or the (−) y-direction).

Each corner where the short side in the first direction (e.g., the x-direction or the (−) x-direction) meets the long side in the second direction (e.g. the y-direction or the (−) y-direction) may be round to have a preset curvature.

The display apparatus 1 may include the display area DA and the non-display area NDA outside the display area DA. A plurality of pixels PX may be arranged in the display area DA. An image may be provided through an array of the plurality of pixels PX. The pixel PX may be defined as a region in which light is emitted from light-emitting elements of the display apparatus 1. As an example, the plurality of pixels PX may each include a red sub-pixel, a green sub-pixel, and a blue sub-pixel. Alternatively, the plurality of pixels PX may each include a red sub-pixel, a green sub-pixel, a blue sub-pixel, and a white sub-pixel.

In an embodiment, the display area DA may include a front display area FDA, a side display area SDA, and an intermediate display area MDA. The plurality of pixels PX may be arranged in each of the front display area FDA, the side display area SDA, and the intermediate display area MDA.

The front display area FDA may include a flat surface. In an embodiment, a ratio of the front display area FDA to the display area DA of the display apparatus 1 may be largest, and thus, the front display area FDA may provide most of an image.

At least a portion of the side display area SDA may be bent to include a curved surface and may extend to the outside from each edge of the front display area FDA. In an embodiment, the side display area SDA may include a first side display area SDA1, a second side display area SDA2, a third side display area SDA3, and a fourth side display area SDA4. In an embodiment, at least one of the first side display area SDA1, the second side display area SDA2, the third side display area SDA3, and the fourth side display area SDA4 may be omitted.

In an embodiment, the first side display area SDA1 may be adjacent to a first edge FDA-E1 of the front display area FDA and may extend to the outside in the (−) y-direction from the first edge FDA-E1. The second side display area SDA2 may be adjacent to a second edge FDA-E2 of the front display area FDA and may extend to the outside in the x-direction from the second edge FDA-E2. The third side display area SDA3 may be adjacent to a third edge FDA-E3 of the front display area FDA and may extend to the outside in the y-direction from the third edge FDA-E3. The fourth side display area SDA4 may be adjacent to a fourth edge FDA-E4 of the front display area FDA and may extend to the outside in the (−) x-direction from the fourth edge FDA-E4. In this case, the first side display area SDA1 may be arranged opposite the third side display area SDA3 with the front display area FDA therebetween, and the second side display area SDA2 may be arranged opposite the fourth side display area SDA4 with the front display area FDA therebetween.

As shown in FIG. 1, the first to fourth side display areas SDA1, SDA2, SDA3, and SDA4 may each include a bent curved surface with a constant curvature. As an example, the first side display area SDA1 and the third side display area SDA3 may each include a bent curved surface around a bending axis extending in the x-direction, and the second side display area SDA2 and the fourth side display area SDA4 may each include a bent curved surface around a bending axis extending in the y-direction. The curvatures of the first to fourth side display areas SDA1, SDA2, SDA3, and SDA4 may be the same or different from one another. As an example, the curvature of the first side display area SDA1 may be the same as the curvature of the third side display area SDA3, and the curvature of the second side display area SDA2 may be the same as the curvature of the fourth side display area SDA4. As an example, the curvature of the first side display area SDA1 may be different from the curvature of the second side display area SDA2. As another example, the curvature of the first side display area SDA1 may be the same as the curvature of the second side display area SDA2.

The intermediate display area MDA may be arranged between the front display area FDA and a corner area CA described below. In addition, the intermediate display area MDA may be arranged between the side display area SDA and the corner area CA. The intermediate display area MDA may extend between the front display area FDA and the corner area CA and between the side display area SDA and the corner area CA. As shown in FIG. 1, in the case where the display apparatus 1 has a quadrangular shape in a plan view, four intermediate display areas MDA may be provided.

In an embodiment, not only the plurality of pixels PX are arranged in the intermediate areas MDA but also a driver, etc. may be arranged in the intermediate display areas MDA, the driver being configured to transfer electric signals or power to the display area DA. In an embodiment, the pixels PX arranged in the intermediate areas MDA may be arranged over the driver to overlap the driver arranged in the intermediate display areas MDA in a plan view. In an embodiment, a pixel circuit that drives the pixels PX in the intermediate areas MDA may be arranged in the front display area FDA, the side display area SDA, and/or the corner area CA adjacent to the intermediate display areas MDA.

The display apparatus 1 of FIG. 1 may be configured to display an image on the side display areas SDA and the intermediate display areas MDA as well as the front display area FDA. Accordingly, a ratio of the display area DA to the display apparatus 1 may increase. That is, in the display apparatus 1 having the same size, the area of the non-display area NDA may be reduced, and the area of the display area DA may increase.

The pixels PX are not arranged in the non-display area NDA of the display apparatus 1, and thus, the non-display area NDA may be a region on which an image is not displayed. The non-display area NDA may include the peripheral area PA outside the display area DA. The peripheral area PA may surround the display area DA entirely or partially. The driver, etc. may be arranged in the peripheral area PA, the driver being configured to transfer electric signals or power to the display area DA.

In an embodiment, the non-display area NDA may include the corner area CA. The corner area CA may be arranged on a corner side where two edges of the front display area FDA that are adjacent to each other meet. As an example, the corner area CA may be arranged on the corner side where the first edge FDA-E1 meets the second edge FDA-E2 of the front display area FDA. The corner area CA may be adjacent to the first side display area SDA1 and the second side display area SDA2. As shown in FIG. 1, in the case where the display apparatus 1 has a quadrangular shape in a plan view, four corner areas CA may be provided.

Because the corner area CA is arranged between the side display areas SDA adjacent to each other and having curved surfaces that are bent in different directions, the corner area CA may include a curved surface in which curved surfaces bent in various directions are continuously connected. In addition, in the case where the curvatures of the side display areas SDA adjacent to each other are different from each other, the curvature of the corner area CA may gradually change along the edge of the display apparatus 1. As an example, in the case where the curvature of the first side display area SDA1 is different from the curvature of the second side display area SDA2, the corner area CA between the first side display area SDA1 and the second side display area SDA2 may have a curvature that gradually changes depending on the position thereof.

Though the first side display area SDA1, the second side display area SDA2, and the corner area CA therebetween are described as an example, the description is similarly applicable to other three corner areas CA.

Figure 2:
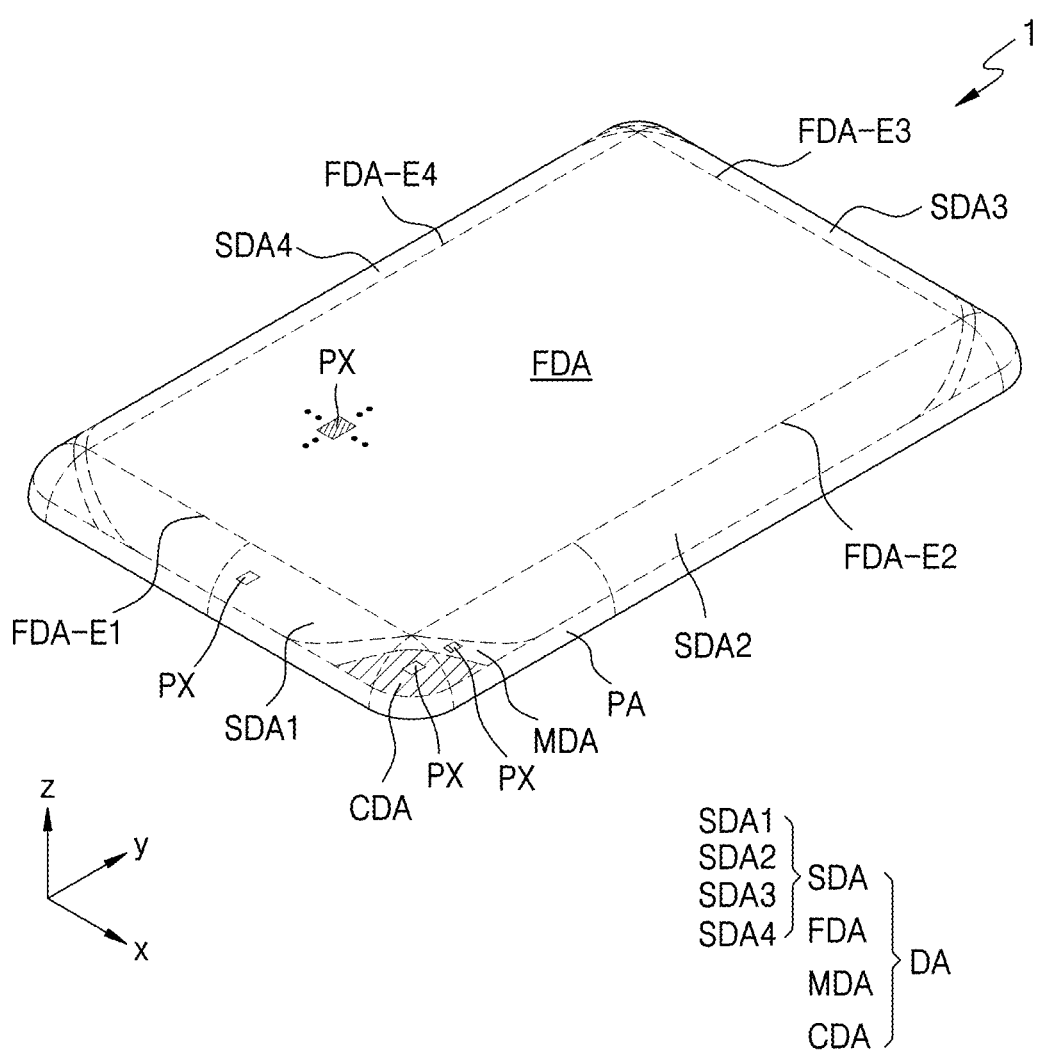
FIG. 2 is a perspective view of a display apparatus according to another embodiment.

FIG. 2 is a perspective view of the display apparatus 1 according to another embodiment. The same descriptions as those described with reference to FIG. 1 are omitted and differences are mainly described below.

Referring to FIG. 2, the display area DA may include the front display area FDA, the side display area SDA, the intermediate display area MDA, and a corner display area CDA. The plurality of pixels PX may be arranged in each of the front display area FDA, the side display area SDA, the intermediate display area MDA, and the corner display area CDA. Descriptions of the front display area FDA and the side display area SDA are the same as those described with reference to FIG. 1, and thus, the descriptions thereof are omitted.

The intermediate display area MDA may be arranged between the front display area FDA and the corner display area CDA described below. In addition, the intermediate display area MDA may be arranged between the side display area SDA and the corner display area CDA. The intermediate display area MDA may extend between the front display area FDA and the corner display area CDA and between the side display area SDA and the corner display area CDA. As shown in FIG. 2, in the case where the display apparatus 1 has a quadrangular shape in a plan view, four intermediate display areas MDA may be provided. In an embodiment, a pixel circuit that drives the pixels PX in the intermediate areas MDA may be arranged in the front display area FDA, the side display area SDA, and/or the corner display area CDA adjacent to the intermediate display areas MDA.

The corner display area CDA may be arranged on the corner side of the display apparatus 1 and may include a curved surface. Here, the corner of the display apparatus 1 may be a portion where the short side of the display apparatus 1 in the first direction (e.g., the x-direction or (−)x-direction) meets the long side of the display apparatus 1 in the second direction (e.g., the y-direction or (−)y-direction). As shown in FIG. 2, in the case where the display apparatus 1 has a quadrangular shape in a plan view, four corner display areas CDA may be provided.

The corner display area CDA may be arranged on the corner side where two edges of the front display area FDA meet each other. That is, the corner display area CDA may be adjacent to the two side display areas SDA. As an example, the corner display areas CDA may be arranged on the corner side where the first edge FDA-E1 meets the second edge FDA-E2 of the front display area FDA and be adjacent to the first side display area SDA1 and the second side display area SDA2.

Because the corner display area CDA is arranged between the side display areas SDA adjacent to each other and having curved surfaces that are bent in different directions, the corner display area CDA may include a curved surface in which curved surfaces bent in various directions are continuously connected. In addition, in the case where the curvatures of the side display areas SDA adjacent to each other are different from each other, the curvature of the corner display area CDA may gradually change along the edge of the display apparatus 1. As an example, in the case where the curvature of the first side display area SDA1 is different from the curvature of the second side display area SDA2, the corner display area CDA between the first side display area SDA1 and the second side display area SDA2 may have a curvature that gradually changes depending on the position thereof.

Though the first side display area SDA1, the second side display area SDA2, and the corner display area CDA therebetween are described as an example, the description is similarly applicable to other three corner display areas CDA.

The display apparatus 1 of FIG. 2 may be configured to display an image in not only the front display area FDA, the side display area SDA, and the intermediate display area MDA, but also the corner display area CDA. Accordingly, a ratio of the display area DA to the display apparatus 1 may increase even more. That is, in the display apparatus 1 having the same size, the area of the non-display area NDA may be reduced, and the area of the display area DA may increase. In addition, because the display apparatus 1 includes the corner display area CDA that includes a round curved surface at the corner thereof and displays an image, the aesthetic sense of the display apparatus 1 may be effectively improved.

The non-display area NDA of the display apparatus 1 of FIG. 2 may include the peripheral area PA outside the display area DA. In an embodiment, the peripheral area PA may entirely surround the front display area FDA, four side display areas SDA, and four corner display areas CDA.

Though the display apparatus 1 of FIG. 2 is described as an example, for convenience of description, the descriptions below are equally applicable to the display apparatus 1 of FIG. 1.

Figure 3:
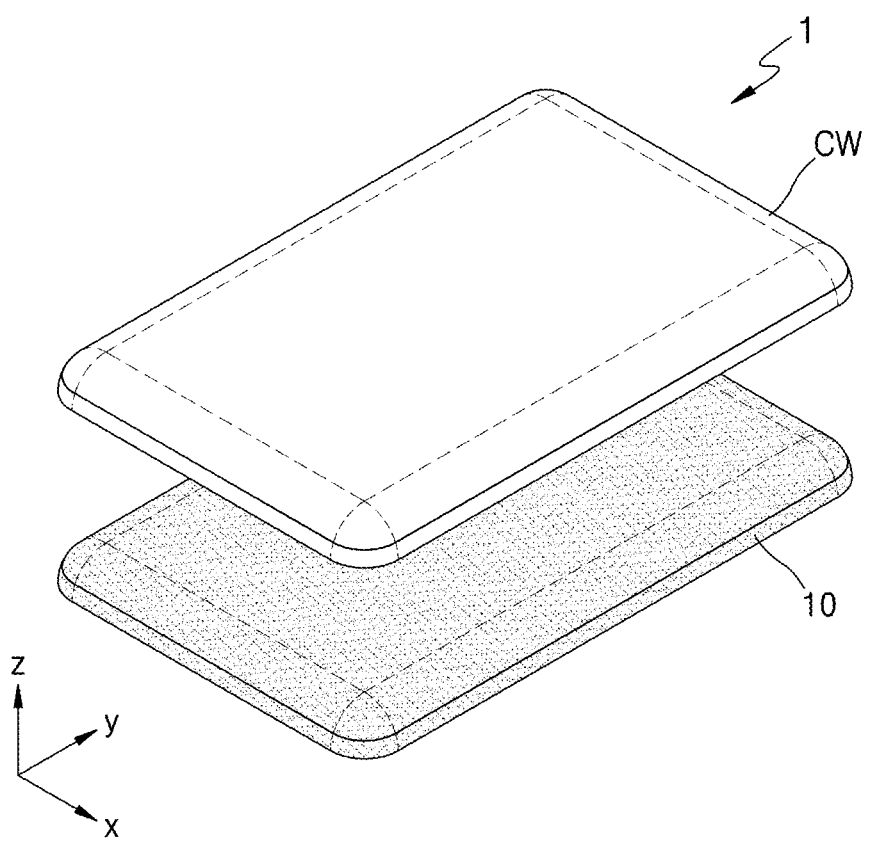
FIG. 3 is an exploded perspective view of a display panel and a cover window of a display apparatus according to an embodiment.

FIG. 3 is an exploded perspective view of the display panel 10 and a cover window CW of the display apparatus 1 according to an embodiment.

Referring to FIG. 3, the display apparatus 1 may include the display panel 10 and the cover window CW. The cover window CW may be arranged on the front surface of the display panel 10. Here, the 'front surface' of the display panel 10 may be defined as a surface facing a direction in which the display panel 10 displays an image.

In an embodiment, the cover window CW may be arranged to cover the front surface of the display panel 10. The cover window CW may protect the front surface of the display panel 10. In addition, the cover window may form the appearance of the display apparatus 1 and include the plane and the curved surfaces corresponding to the shape of the display apparatus 1.

The cover window CW may be attached to the display panel 10 through an adhesive layer (not shown). The adhesive layer may include an adhesive member such as an optically clear adhesive ("OCA") or a pressure sensitive adhesive ("PSA").

The cover window CW may have a high transmittance to transmit light emitted from the display panel 10 and have a thin thickness to reduce the weight of the display apparatus 1. In addition, the cover window CW may have strong strength and hardness to protect the display panel 10 from external impacts. As an example, the cover window CW may be a flexible window. The cover window CW may protect the display panel 10 while being easily bent according to external force without generating a crack, etc. As another example, the cover window CW may include glass or plastic. As an example, the cover window CW may be ultra thin glass ("UTG") whose strength has been reinforced through chemical reinforcement or thermal reinforcement, etc.

An image displayed on the display panel 10 may be provided to a user through the cover window CW that is transparent. That is, it may be understood that an image provided by the display apparatus 1 is implemented by the display panel 10, and thus, it may be understood that the display area DA (see FIG. 2) and the non-display area NDA (see FIG. 2) of the display apparatus 1 are provided to the display panel 10.

Figure 4A:
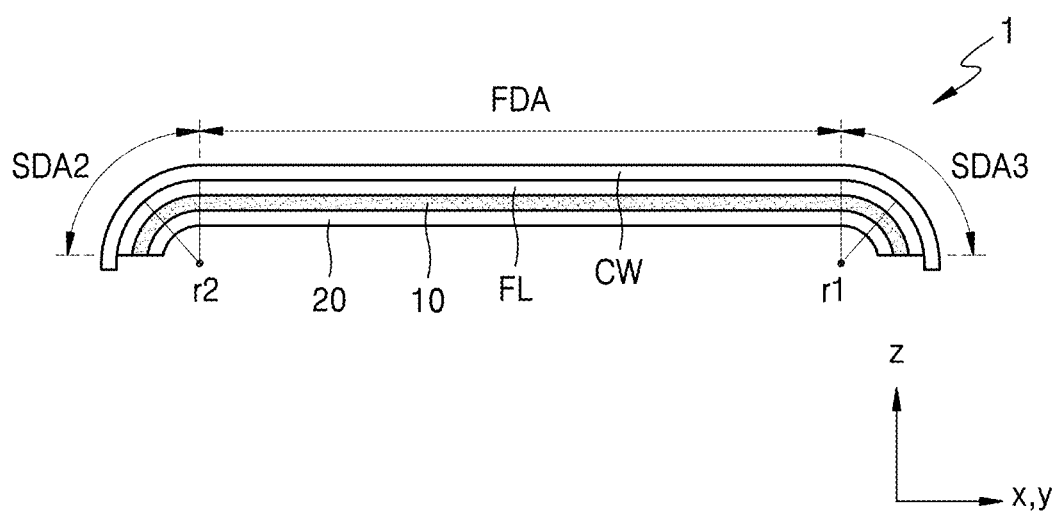
FIGS. 4A and 4B are cross-sectional views of a portion of a display apparatus according to an embodiment.
Figure 4B:
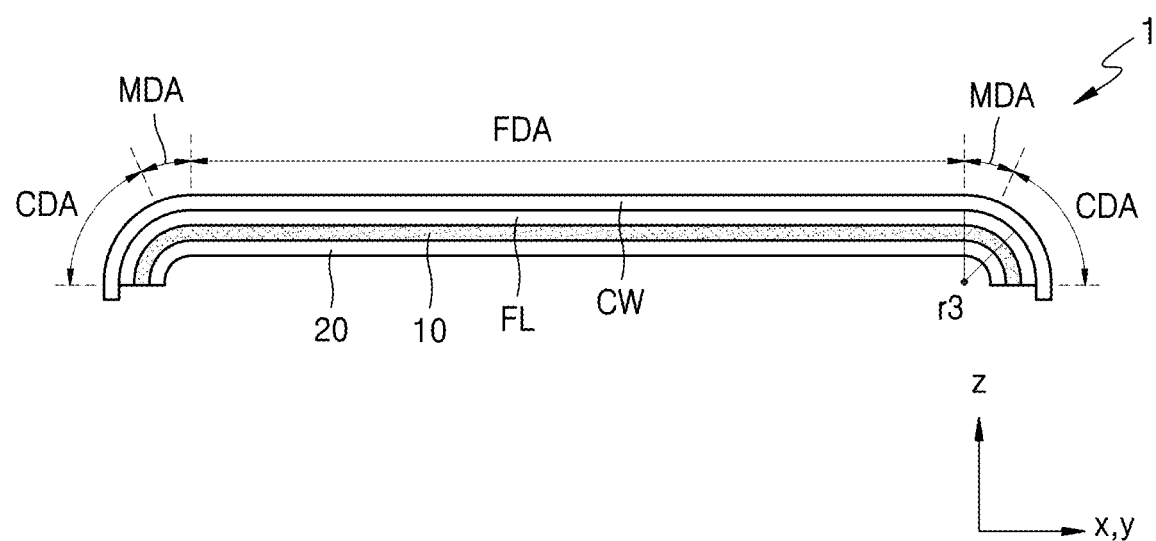

FIGS. 4A and 4B are cross-sectional views of a portion of the display apparatus 1 according to an embodiment. FIG. 4A shows the cross-sections of the front display area FDA, the second side display area SDA2, and the third side display area SDA3 of the display apparatus 1, and FIG. 4B shows the cross-sections of the front display area FDA and the two corner display areas CDA of the display apparatus 1. In FIGS. 4A and 4B, the same reference numerals are used for the same elements, and thus, repeated descriptions are omitted.

First, referring to FIG. 4A, the display apparatus 1 may include a functional layer FL and the cover window CW arranged on the front surface of the display panel 10. In addition, in the display apparatus 1, a lower protection layer 20 may be arranged on the rear surface of the display panel 10.

The functional layer FL may be attached to the front surface of the display panel 10 in the form of a film through an adhesive member. For the adhesive member, a general adhesive member known in the art may be employed without limitation. As an example, the adhesive member may be an optical clear adhesive (OCA) or a pressure sensitive adhesive (PSA).

In an embodiment, the functional layer FL may be an optical functional layer configured to reduce the reflectivity of light (external light) incident toward the display panel 10 from the outside and/or improve the color purity of light emitted from the display panel 10. In this case, the functional layer FL may be a polarizing film including a retarder and/or a polarizer. The retarder may include a $\lambda/2$ retarder and/or a $\lambda/4$ retarder.

The lower protection layer 20 may be attached to the rear surface of the display panel 10 in the form of a film through an adhesive member. For the adhesive member, a general adhesive member known in the art may be employed without limitation. As an example, the adhesive member may be an optical clear adhesive (OCA) or a pressure sensitive adhesive (PSA). As an example, the lower protection layer 20 may have a thickness ranging from about 50 micrometers (μm) to about 400 μm.

In an embodiment, the lower protection layer 20 may protect the display panel 10 from the outside. As an example, the lower protection layer 20 may absorb physical impacts from the outside and block the penetration of foreign substance or moisture, etc. into the display panel 10.

In an embodiment, the front display area FDA may be flat. The second side display area SDA2 and the third side display area SDA3 may be bent while having an arbitrary curvature radius. As an example, a second curvature radius r2 of the second side display area SDA2 may be different from a first curvature radius r1 of the third side display area SDA3. As another example, the second curvature radius r2 of the second side display area SDA2 may be the same as the first curvature radius r1 of the third side display area SDA3. Hereinafter, the case where the second curvature radius r2 of the second side display area SDA2 is different from the first curvature radius r1 of the third side display area SDA3 is mainly described in detail.

Though not shown in FIG. 4A, the first side display area SDA1 (see FIG. 2) may be the same as or similar to the third side display area SDA3, and the fourth side display area SDA4 (see FIG. 2) may be the same as or similar to the second side display area SDA2. Hereinafter, for convenience of description, the case where the first side display area SDA1 and the third side display area SDA3 have the first curvature radius r1, and the second side display area SDA2 and the fourth side display area SDA4 have the second curvature radius r2 is mainly described in detail.

Referring to FIG. 4B, the corner display area CDA may be arranged on the corner side of the front display area FDA, and the intermediate display area MDA may be arranged between the corner display area CDA and the front display area FDA. The intermediate display area MDA and the corner display area CDA may be bent with a third curvature radius r3 that varies depending on a position. As an example, in the case where the first curvature radius r1 of the first side display area SDA1 is different from the second curvature radius r2 of the second side display area SDA2, the corner display area CDA adjacent to the first side display area SDA1 and the second side display area SDA2 may have the third curvature radius r3 that gradually varies within the range between the first curvature radius r1 and the second curvature radius r2.

Figure 5:
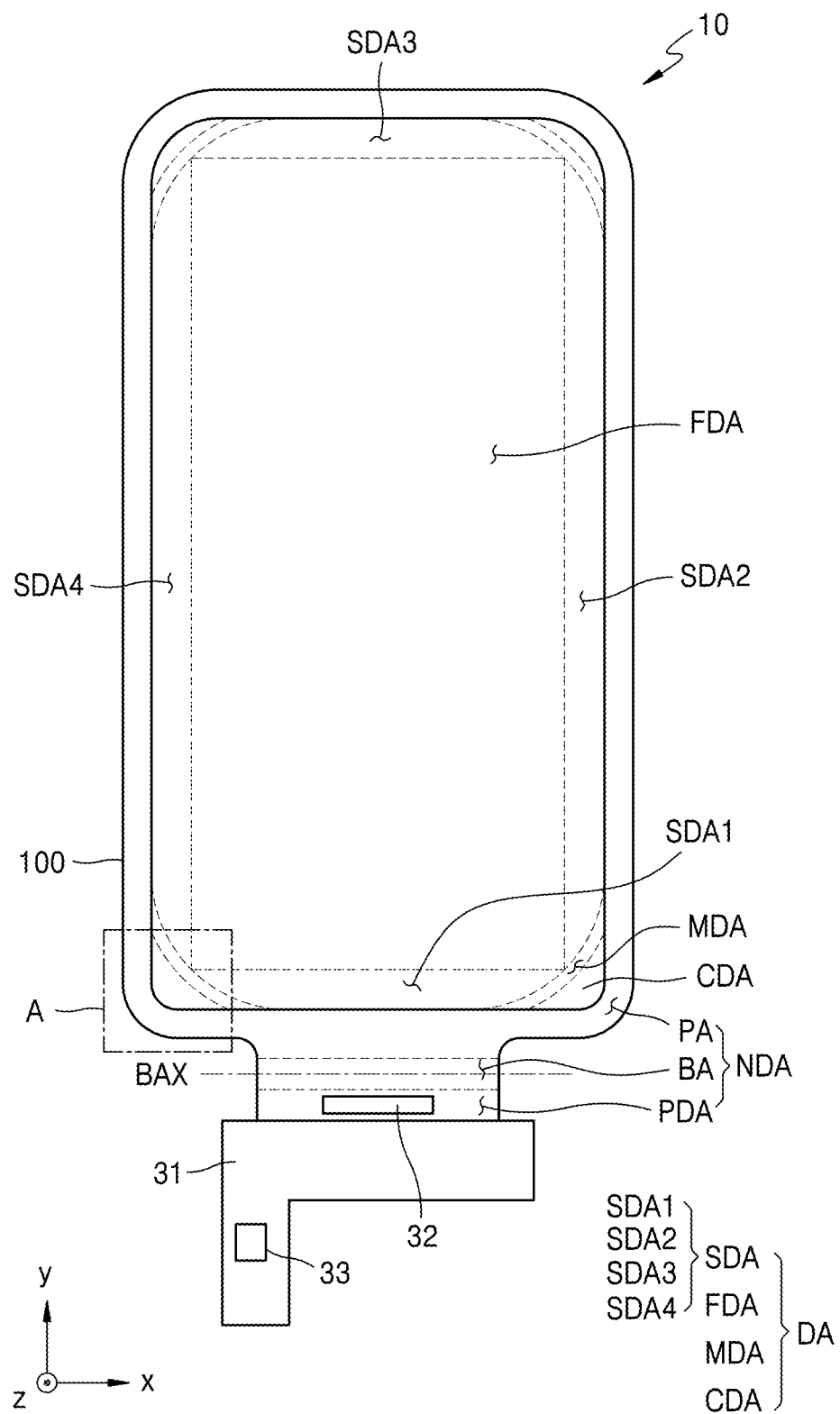
FIG. 5 is a plan view of a portion of a display panel of a display apparatus according to an embodiment.

FIG. 5 is a plan view of a portion of a display panel of the display apparatus 1 according to an embodiment. FIG. 5 shows the display panel 10 before the bending.

Referring to FIG. 2, the display panel 10 may include the display area DA and the non-display area NDA. The display area DA of the display panel 10 may include the front display area FDA, the side display area SDA, the intermediate display area MDA, and the corner display area CDA. The non-display area NDA of the display panel 10 may include a peripheral area PA, a bending area BA, and a pad area PDA, the peripheral area PA being outside the display area DA, the bending area BA being on one side of the peripheral area PA, and the pad area PDA being apart from the peripheral area PA with the bending area BA therebetween. The display area DA and the non-display area NDA of the display panel 10 may correspond to the display area DA and the non-display area NDA of the display apparatus 1 (see FIG. 2), respectively, described with reference to FIG. 2. Hereinafter, for convenience of description, the case where the peripheral area PA surrounds the display area DA entirely as shown in FIG. 5 is described.

The display panel 10 may be bent in the bending area BA such that the display area DA overlaps the pad area PDA in the thickness direction (that is, a z-direction) of the display panel 10. That is, the display panel 10 may be bent such that the pad area PDA may be arranged on the rear surface of the display panel 10 to overlap the display area DA in a plan view. Through this structure, the area of the non-display area NDA may be reduced and the ratio of the display area DA may be increased in the display apparatus 1 that is completed.

A display driver 32 and a display circuit board 31 may be arranged in the pad area PDA. The display driver 32 may receive controls signals and power voltages and generate and output signals and voltages for driving the display panel 10. The display driver 32 may include an integrated circuit ("IC").

The display circuit board 31 may be electrically connected to the display panel 10. As an example, though not shown in FIG. 2, the display circuit board 31 may be electrically connected to a pad portion (not shown) arranged in the pad area PDA through an anisotropic conductive film.

The display circuit board 31 may be a flexible printed circuit board ("FPCB") that is bendable or a rigid printed circuit board ("PCB") that is hard and not easily bendable. Depending on the case, the display circuit board 31 may be a composite printed circuit board including both the rigid PCB and the FPCB.

A sensor driver 33 may be arranged on the display circuit board 31. The sensor driver 33 may include an integrated circuit. The sensor driver 33 may be attached to or built in the display circuit board 31. The sensor driver 33 may be electrically connected to sensing electrodes of a touch sensing layer of the display panel 10 through the display circuit board 31.

In addition, a power supply portion (not shown), etc. may be additionally arranged on the display circuit board 31, the power supply portion supplying voltages for driving pixel circuits of the display panel 10, a scan driver, and the display driver 32. In an embodiment, the power supply portion may be integrated with the display driver 32. In this case, the display driver 32 and the power supply portion may be implemented as one integrated circuit.

In addition, the display circuit board 31 may be electrically connected to a main circuit board (not shown). The main circuit board may include a central processing unit ("CPU"), a graphic processing unit ("GPU"), a memory, a communication chip, digital signal processing ("DSP"), information strategic planning ("ISP"), and a main processor such as an application processor including various kinds of interfaces.

The display panel 10 may include a substrate 100. Various kinds of elements constituting the display panel 10 may be arranged on the substrate 100. As an example, a plurality of light-emitting elements constituting the display area DA, pixel circuits, signal lines and/or voltage lines, and driving circuits, etc., may be arranged on the substrate 100, the pixel circuits driving the light-emitting elements, and the signal lines and/or the voltage lines providing signals and/or voltages to the pixel circuits. The display driver 32 and the display circuit board 31 may be also arranged on the substrate 100. In an embodiment, the display driver 32 and the display circuit board 31 may be arranged over the substrate 100. In another embodiment, in the case where a hole is bored in the substrate 100 and a wiring is arranged in the hole, the display driver 32 and the display circuit board 31 may be arranged under the substrate 100.

Figure 6A:
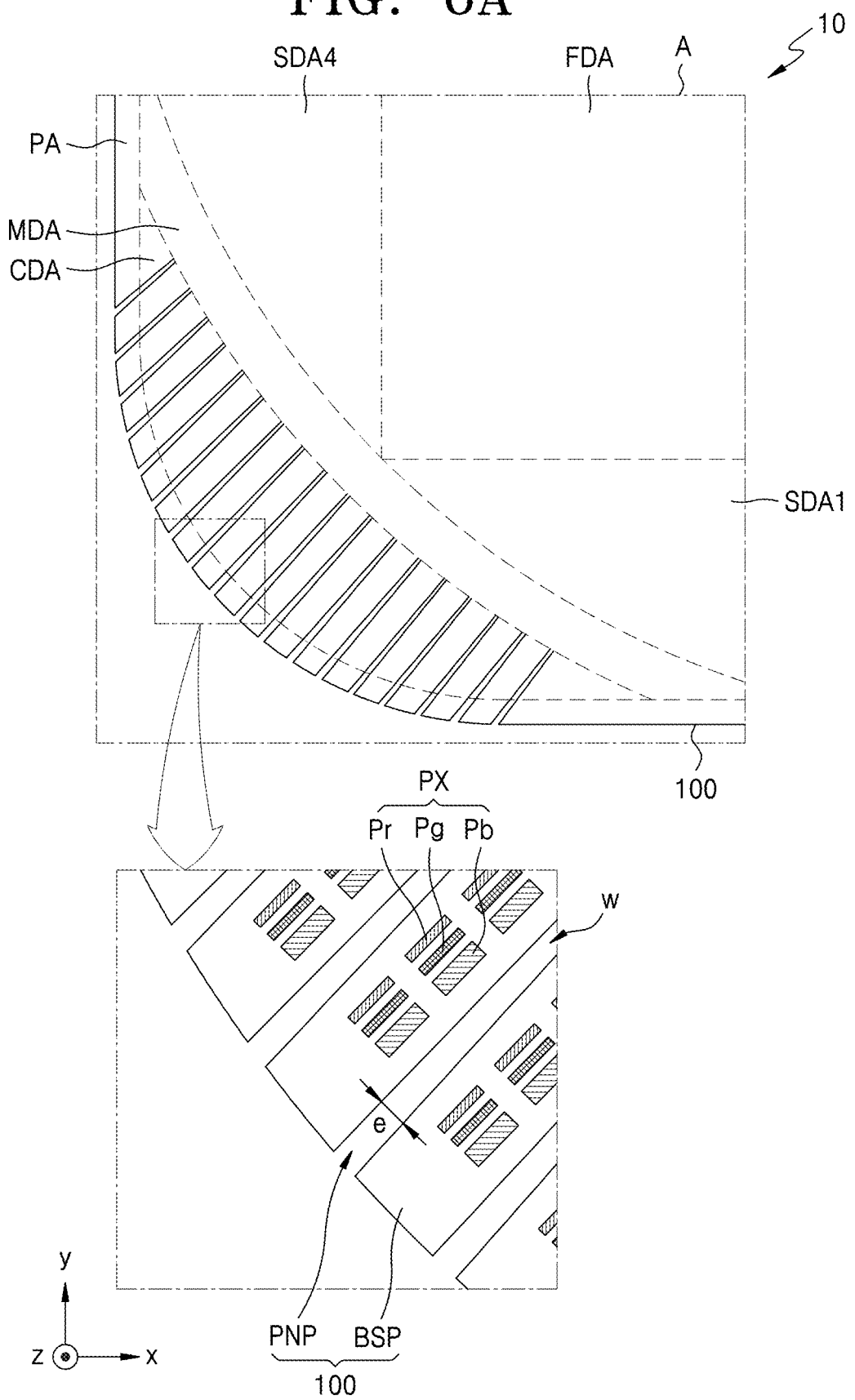
FIGS. 6A and 6B are enlarged plan views of a portion of a display panel according to an embodiment.
Figure 6B:
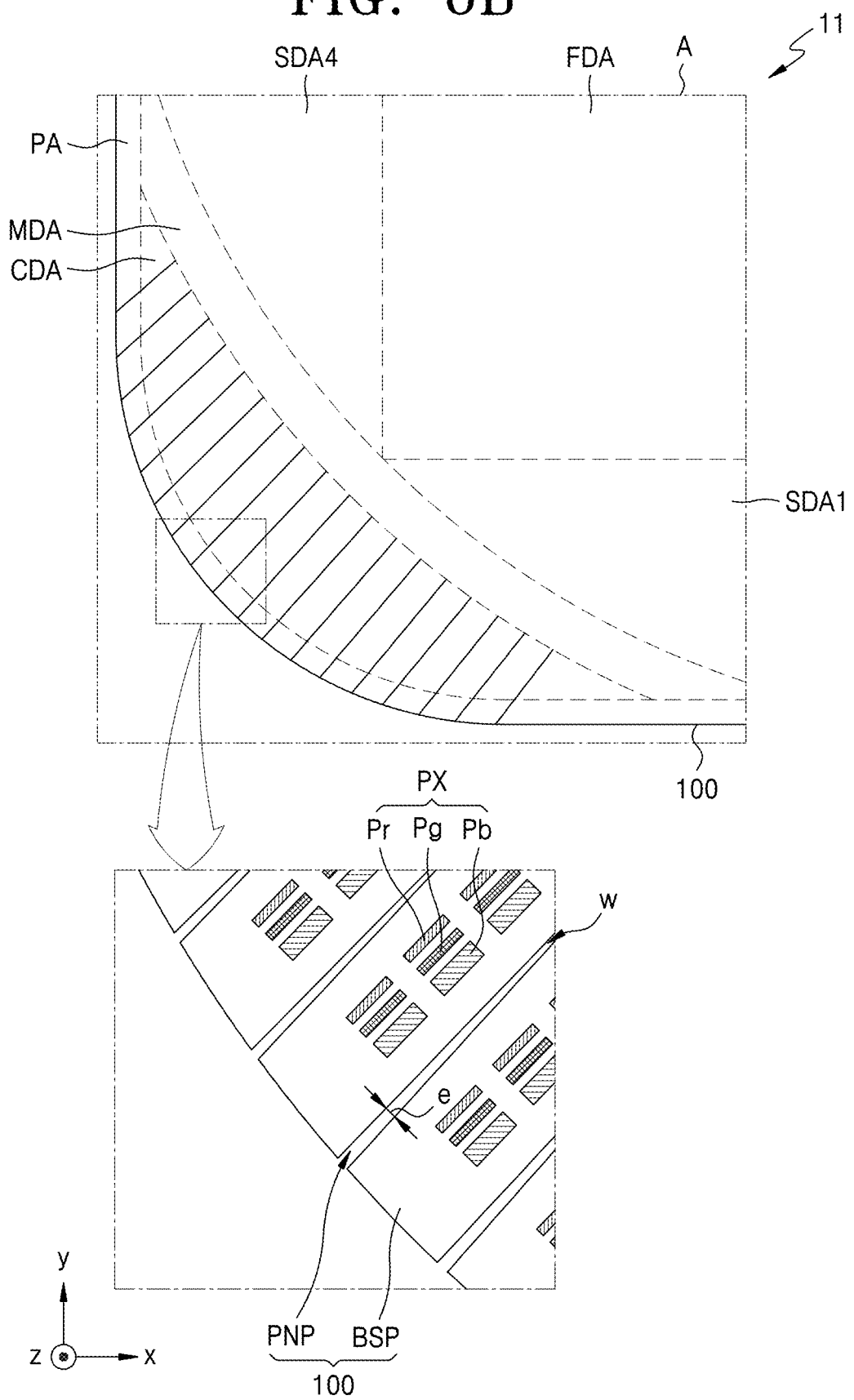

FIGS. 6A and 6B are enlarged plan views of a portion of a display panel according to an embodiment. A region A of FIGS. 6A and 6B may correspond to a region A of FIG. 5. FIG. 6A shows a figure before the display panel 10 is bent, and FIG. 6B shows a figure after the display panel 10 is bent and transformed.

Referring to FIG. 6A, the display panel 10 may define the substrate 100 including a plurality of through-portions PNP and include a plurality of base portions BSP that are apart from each other by the plurality of through-portions PNP. In an embodiment, the plurality of through-portions PNP and the plurality of base portions BSP may be arranged in the corner display area CDA of the substrate 100 and may extend in an outer direction away from the front display area FDA of the substrate 100.

In an embodiment, as an example, the plurality of base portions BSP may each have a shape extending long in the outer direction away from the front display area FDA of the substrate 100. That is, the extension length of the plurality of base portions BSP may be greater than the width of the base portions BSP in a direction crossing the extension direction. One end of the plurality of base portions BSP may be connected to a portion of the substrate 100, and the opposite end of the plurality of base portions BSP may constitute the corner of the substrate 100.

The plurality of base portions BSP may be arranged in parallel to each other or arranged radially. In an embodiment, in the case where the plurality of base portions BSP are arranged in parallel to each other, an interval e between two base portions BSP that are adjacent to each other may be constant in the extension direction of the base portion BSP. In another embodiment, in the case where the plurality of base portions BSP are arranged radially, the interval e between two base portions BSP that are adjacent to each other may gradually increase in the extension direction of the base portion BSP. Hereinafter, for convenience of description, the case where the plurality of base portions BSP are arranged radially as shown in FIG. 6A is described.

Elements such as the pixel circuits, the light-emitting elements, the signal lines, etc., may be arranged on the plurality of base portions BSP. The plurality of pixels PX may be arranged in each of the plurality of base portions BSP. In an embodiment, the plurality of pixels PX may include a red sub-pixel Pr, a green sub-pixel Pg, and a blue sub-pixel Pb. The corner display area CDA may be implemented through the pixels PX on the plurality of base portions BSP.

The through-portion PNP may be arranged between two base portions BSP that are adjacent to each other among the plurality of base portions BSP. The through-portion PNP may be defined by two base portions BSP that are adjacent to each other and a portion connected to the two base portions BSP. The through-portion PNP may extend in an extension direction of the base portion BSP. The through-portion PNP may pass through the upper surface and the lower surface of the display panel 10 and reduce the weight of the display panel 10. Two base portions BSP that are adjacent to each other among the plurality of base portions BSP may be apart by a preset interval e from each other by the through-portion PNP. The through-portion PNP may provide a separation region W between the two base portions BSP that are adjacent to each other. That is, each through-portion PNP may overlap the separation region W in a plan view.

Referring to FIG. 6B, when external force (e.g., bending force or compressing force, etc.) is applied to the display panel 10, the positions of the plurality of base portions BSP may change and the shape of the separation region W between the two base portions BSP that are adjacent to each other may change. Through this structure, both contracting and stretching characteristics may be given to the display panel 10. As an example, when external force is applied to the base portions BSP, each of the base portions BSP may extend in the extension direction, and simultaneously, the area of the separation region W between the two base portions BSP that are adjacent to each other is reduced, and thus, a compression effect may be provided. In addition, in an embodiment, the base portions BSP may each be bent at different curvatures.

Through this structure of the substrate 100, even when the corner display area CDA of the substrate 100 is bent, the damage to the elements arranged in the corner display area CDA of the substrate 100 may be effectively prevented. Because the elements may be arranged in the corner display area CDA of the substrate 100 without damage, the pixels PX may be stably formed in the corner display area CDA. Accordingly, the corner display area CDA of the display apparatus 1 may be implemented, and through this, the display area DA of the display apparatus 1 may be extended.

Figure 7:
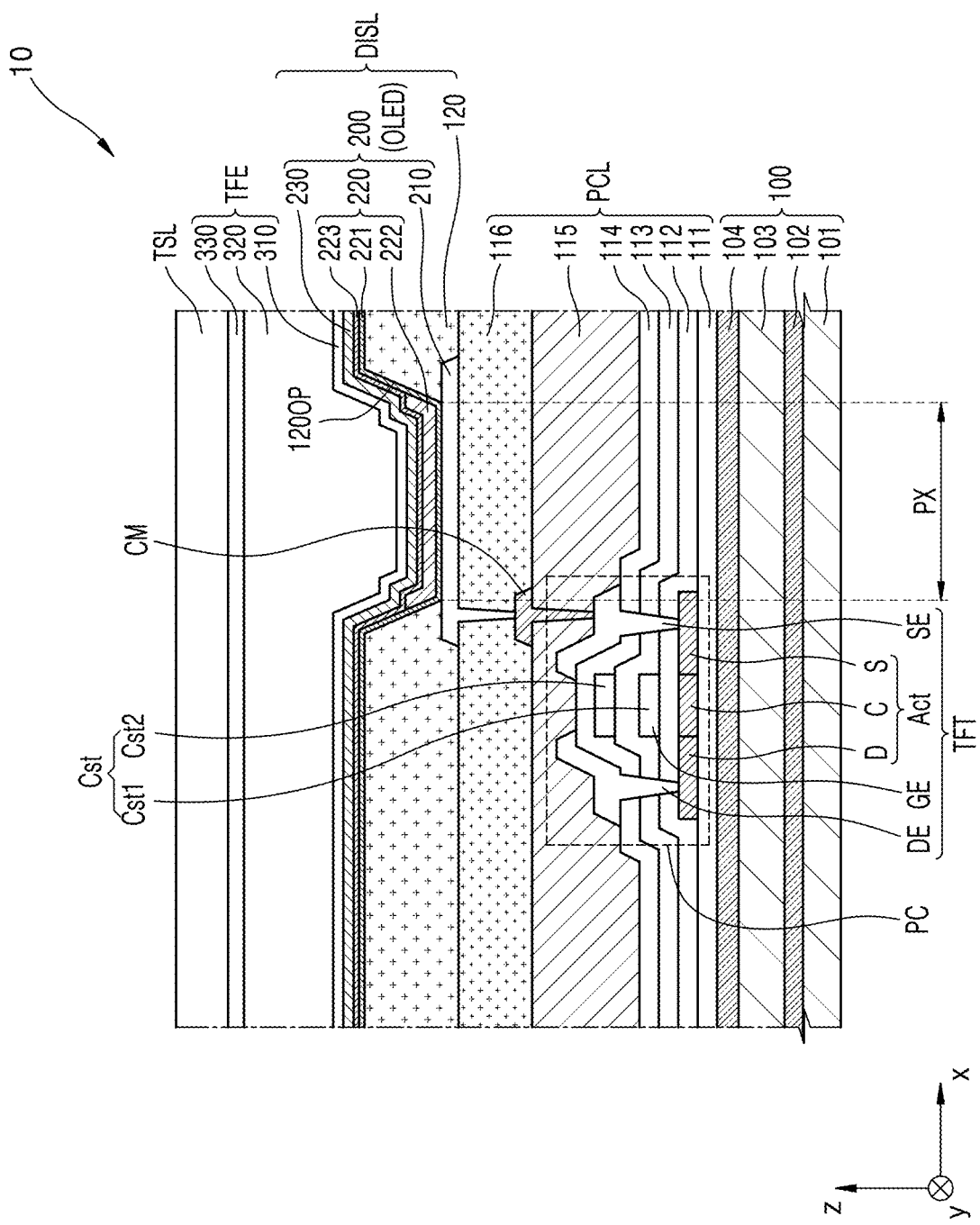
FIG. 7 is a cross-sectional view of a portion of a display panel of a display apparatus according to an embodiment.

FIG. 7 is a cross-sectional view of a portion of the display panel 10 of the display apparatus 1 according to an embodiment.

Referring to FIG. 7, the display panel 10 may include the substrate 100, a pixel circuit layer PCL, a display layer DISL, a thin-film encapsulation layer TFE, and a touch sensing layer TSL.

The substrate 100 may have a multi-layered structure including a base layer and an inorganic layer, the base layer including a polymer resin. As an example, the substrate 100 may include a base layer and a barrier layer, the base layer including a polymer resin, and the barrier layer including an inorganic insulting layer. As an example, the substrate 100 may include a first base layer 101, a first barrier layer 102, a second base layer 103, and a second barrier layer 104 that are sequentially stacked. The first base layer 101 and the second base layer 103 may include polyimide ("PI"), polyethersulfone ("PES"), polyarylate, polyetherimide ("PEI"), polyethylene naphthalate ("PEN"), polyethylene terephthalate ("PET"), polyphenylene sulfide ("PPS"), polycarbonate ("PC"), cellulose tri acetate ("TAC") and/or cellulose acetate propionate ("CAP"). The first barrier layer 102 and the second barrier layer 104 may include an inorganic insulating material such as silicon oxide, silicon oxynitride, and silicon nitride. The substrate 100 may be flexible.

The pixel circuit layer PCL may be arranged on the substrate 100. The pixel circuit layer PCL may include a pixel circuit PC including a thin-film transistor TFT and a storage capacitor Cst. In addition, the pixel circuit layer PCL may include a buffer layer 111, a first gate insulating layer 112, a second gate insulating layer 113, an interlayer insulating layer 114, a first planarization insulating layer 115, and a second planarization insulating layer 116 arranged below and/or above the elements of the pixel circuit PC.

The buffer layer 111 may reduce or block the penetration of foreign substance, moisture, or external air from below the substrate 100 and provide a flat surface on the substrate 100. The buffer layer 111 may include an inorganic insulating material such as silicon oxide, silicon oxynitride, and silicon nitride and have a single-layered structure or a multi-layered structure including the above materials.

The thin-film transistor TFT on the buffer layer 111 may include a semiconductor layer Act. The semiconductor layer Act may include polycrystalline silicon. Alternatively, the semiconductor layer Act may include amorphous silicon, an oxide semiconductor, or an organic semiconductor. The semiconductor layer Act may include a channel region C, a drain region D, and a source region S, and the drain region D and the source region S are arranged on two opposite sides of the channel region C, respectively. A gate electrode GE may overlap the channel region C in a plan view.

The gate electrode GE may include a low-resistance metal material. The gate electrode GE may include a conductive material including molybdenum (Mo), aluminum (Al), copper (Cu), and titanium (Ti) and have a single-layered structure or a multi-layered structure including the above materials.

The first gate insulating layer 112 between the semiconductor layer Act and the gate electrode GE may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The second gate insulating layer 113 may cover the gate electrode GE. Similar to the first gate insulating layer 112, the second gate insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An upper electrode Cst2 of the storage capacitor Cst may be arranged on the second gate insulating layer 113. The upper electrode Cst2 may overlap the gate electrode GE therebelow in a plan view. In this case, the gate electrode GE and the upper electrode Cst2 overlapping each other with the second gate insulating layer 113 therebetween may constitute the storage capacitor Cst. That is, the gate electrode GE may serve as a lower electrode Cst1 of the storage capacitor Cst.

As described above, the storage capacitor Cst may overlap the thin-film transistor TFT. In an embodiment, the storage capacitor Cst may not overlap the thin-film transistor TFT in a plan view.

The upper electrode Cst2 may include aluminum (Al), platinum (Pt), palladium (Pd), silver (Ag), magnesium (Mg), gold (Au), nickel (Ni), neodymium (Nd), iridium (Ir), chrome (Cr), calcium (Ca), molybdenum (Mo), titanium (Ti), tungsten (W), and/or copper (Cu) and include a single layer or a multi-layer including the above materials.

The interlayer insulating layer 114 may cover the upper electrode Cst2. The interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$). The interlayer insulating layer 114 may include a single layer or a multi-layer including the above inorganic insulating material.

The drain electrode DE and the source electrode SE may be arranged on the interlayer insulating layer 114. The drain electrode DE and the source electrode SE may be connected to the drain region and the source region S, respectively, through contact holes of the insulating layers therebelow. The drain electrode DE and the source electrode SE may each include a material having excellent conductivity. The drain electrode DE and the source electrode SE may include a conductive material including molybdenum (Mo), aluminum (Al), copper (Cu), and titanium (Ti) and have a single-layered structure or a multi-layered structure including the above materials. In an embodiment, the drain electrode DE and the source electrode SE may have a multi-layered structure of Ti/Al/Ti.

The first planarization insulating layer 115 may cover the drain electrode DE and the source electrode SE. The first planarization insulating layer 115 may include an organic insulating material including a general-purpose polymer such as polymethylmethacrylate ("PMMA") or polystyrene ("PS"), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The second planarization insulating layer 116 may be arranged on the first planarization insulating layer 115. The second planarization insulating layer 116 may include the same material as that of the first planarization insulating layer 115 and include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend thereof.

The display layer DISL may be arranged on the pixel circuit layer PCL having the above-described structure. The display layer DISL may include a light-emitting element 200 and a pixel-defining layer 120. The light-emitting element 200 may include, for example, an organic light-emitting diode OLED. The organic light-emitting diode OLED may include a stack structure of a pixel electrode 210, an intermediate layer 220, and an opposite electrode 230. The organic light-emitting diode OLED may emit, for example, red, green, or blue light or emit red, green, blue, or white light. The organic light-emitting diode OLED may emit light through an emission area. The emission area may be defined as a pixel PX.

The pixel electrode 210 may be arranged on the second planarization insulating layer 116. The pixel electrode 210 may contact a contact metal CM on the first planarization insulating layer 115 through a contact hole formed in the second planarization insulating layer 116 and the first planarization insulating layer 115 and be electrically connected to the thin-film transistor TFT through the contact metal CM.

The pixel electrode 210 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In another embodiment, the pixel electrode 210 may include a reflective layer including silver (Ag), magnesium (Mg), aluminum (Al), platinum (Pt), palladium (Pd), gold (Au), nickel (Ni), neodymium (Nd), iridium (Ir), chrome (Cr), or a compound thereof. In another embodiment, the pixel electrode 210 may further include a layer on/under the reflective layer, the layer including ITO, IZO, ZnO, or $In_2O_3$.

The pixel-defining layer 120 is arranged on the pixel electrode 210, the pixel-defining layer 120 defining an opening 120OP that exposes the central portion of the pixel electrode 210. The pixel-defining layer 120 may include an organic insulating material and/or an inorganic insulating material. The opening 120OP may define an emission area of light emitted from the light-emitting element 200. As an example, the size/width of the opening 120OP may correspond to the size/width of the emission area. Accordingly, the size and/or width of the pixel PX may depend on the size and/or width of the opening 120OP of the pixel-defining layer 120.

The intermediate layer 220 may include an emission layer 222 corresponding to the pixel electrode 210. The emission layer 222 may include a polymer organic material or a low-molecular weight organic material that emits light of a preset color. Alternatively, the emission layer 222 may include an inorganic light-emitting material or quantum dots.

A first functional layer 221 and a second functional layer 223 may each be arranged under and on the emission layer 222. The first functional layer 221 may include, for example, a hole transport layer ("HTL"), or an HTL and a hole injection layer ("HIL"). The second functional layer 223 is an element arranged on the emission layer 222 and may include an electron transparent layer ("ETL") and/or an electron injection layer ("EIL"). Like the opposite electrode 230, the first functional layer 221 and/or the second functional layer 223 may be common layers formed to cover the substrate 100 entirely.

The opposite electrode 230 may be arranged on the pixel electrode 210 and may overlap the pixel electrode 210 in a plan view. The opposite electrode 230 may include a conductive material having a small work function. As an example, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy thereof. Alternatively, the opposite electrode 230 may include a layer on the (semi) transparent layer, the layer including ITO, IZO, ZnO, or $In_2O_3$. The opposite electrode 230 may be formed as one body to cover the substrate 100 entirely.

The display panel 10 includes a plurality of light-emitting elements 200. The plurality of light-emitting elements emit light through the pixels PX, thereby displaying an image.

That is, the display area DA (see FIG. 2) may be defined by the plurality of light-emitting elements 200.

The thin-film encapsulation layer TFE may be arranged on the opposite electrode 230 and may cover the light-emitting elements 200 of the display layer DISL. The thin-film encapsulation layer TFE may include at least one inorganic encapsulation layer and at least one organic encapsulation layer. In an embodiment, it is shown in FIG. 7 that the thin-film encapsulation layer TFE includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include at least one inorganic material from among aluminum oxide, titanium oxide, tantalum oxide, hafnium oxide, or zinc oxide, silicon oxide, silicon nitride, and silicon oxynitride. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate. The organic encapsulation layer 320 may be formed by hardening monomer or coating polymer. The organic encapsulation layer 320 may have transparency.

The touch sensing layer TSL may be arranged on the thin-film encapsulation layer TFE. In an embodiment, as shown in FIG. 7, the touch sensing layer TSL may be directly formed on the thin-film encapsulation layer TFE. In this case, an adhesive layer may not be arranged between the touch sensing layer TSL and the thin-film encapsulation layer TFE.

The touch sensing layer TSL may obtain coordinate information corresponding to an external input, for example, a touch event. The touch sensing layer TSL may include a sensing electrode and signal lines connected to the sensing electrode. The touch sensing layer TSL may sense an external input through a mutual-capacitive method or a self-capacitive method.

In the above, though description has been made to the case where the display apparatus 1 includes the organic light-emitting diode OLED as a light-emitting element, the display apparatus 1 according to an embodiment is not limited thereto. In another embodiment, the display apparatus 1 may be a light-emitting display apparatus including an inorganic light-emitting diode, that is, an inorganic light-emitting display. In another embodiment, the display apparatus 1 may be a quantum-dot light-emitting display. However, for convenience of description, the case where the display apparatus 1 includes an organic light-emitting diode OLED is described below.

Figure 8:
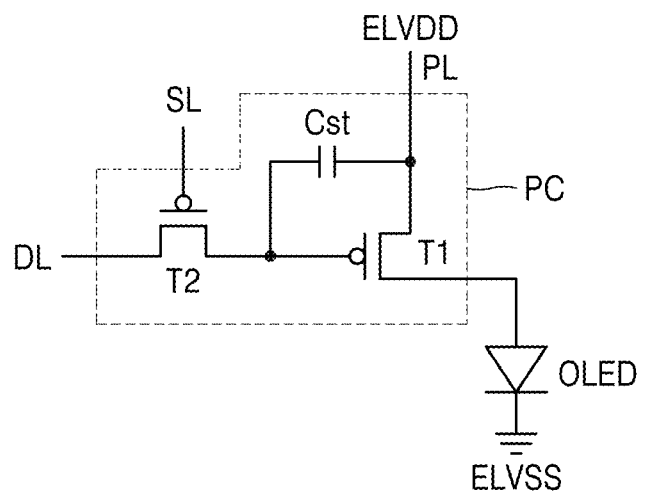
FIG. 8 is an equivalent circuit diagram of a pixel circuit of a display apparatus according to an embodiment.

FIG. 8 is an equivalent circuit diagram of a pixel circuit of a display apparatus according to an embodiment.

Referring to FIG. 8, the pixel circuit PC may include a plurality of thin-film transistors TFT (see FIG. 7) and the storage capacitor Cst and be electrically connected to the organic light-emitting diode OLED. In an embodiment, the pixel circuit PC may include a driving thin-film transistor T1, a switching thin-film transistor T2, and the storage capacitor Cst.

The switching thin-film transistor T2 may be connected to a scan line SL and a data line DL and configured to transfer a data signal or a data voltage to the driving thin-film transistor T1 based on a scan signal or a switching voltage input from the scan line SL, the data signal or the data voltage being input from the data line DL. The storage capacitor Cst may be connected to the switching thin-film transistor T2 and a driving voltage line PL and configured to store a voltage corresponding to a difference between a voltage transferred from the switching thin-film transistor T2 and a first power voltage ELVDD supplied to the driving voltage line PL.

The driving thin-film transistor T1 may be connected to the driving voltage line PL and the storage capacitor Cst and configured to control a driving current flowing from the driving voltage line PL to the organic light-emitting diode OLED according to the voltage stored in the storage capacitor Cst. The opposite electrode (e.g., a cathode) of the organic light-emitting diode OLED may receive a second power voltage ELVSS. The organic light-emitting diode OLED may emit light having a preset brightness according to the driving current.

Though it has been described that the pixel circuit PC includes two thin-film transistors and one storage capacitor, the embodiment according to the invention is not limited thereto. As an example, the pixel circuit PC may include three or more thin-film transistors and/or two or more storage capacitors in another embodiment. In still another embodiment, the pixel circuit PC may include seven thin-film transistors and one storage capacitor. The number of thin-film transistors and the number of storage capacitors may be variously modified depending on the design of the pixel circuit PC. However, for convenience of description, the case where the pixel circuit PC includes two thin-film transistors and one storage capacitor is described below.

FIGS. 9A to 9F are side views showing a method of manufacturing a display apparatus according to an embodiment.

Figure 9A:
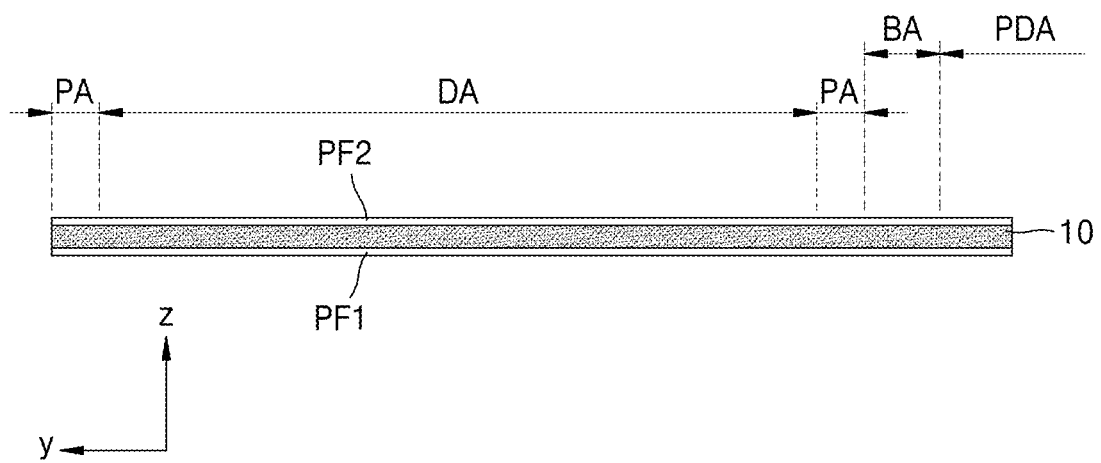
FIGS. 9A to 9F are side views showing a method of manufacturing a display apparatus according to an embodiment.

First, referring to FIG. 9A, the display panel 10 may be prepared, and the display panel 10 includes the display area DA, the peripheral area PA, the bending area BA, and the pad area PDA, the peripheral area PA is outside the display area DA, the bending area BA is disposed on one side of the peripheral area PA, and the pad area PDA is spaced apart from the peripheral area PA with the bending area BA therebetween.

According to an embodiment, a first protection film PF1 and a second protection film PF2 may be attached to the rear surface and the front surface of the display panel 10, respectively. The first protection film PF1 and the second protection film PF2 may protect the surfaces of the display panel 10. As an example, the first protection film PF1 and the second protection film PF2 may include a polymer resin. Here, the front surface of the display panel 10 denotes a surface in a direction in which the display panel 10 displays an image, and the rear surface of the display panel 10 denotes a surface opposite the front surface.

Figure 9B:
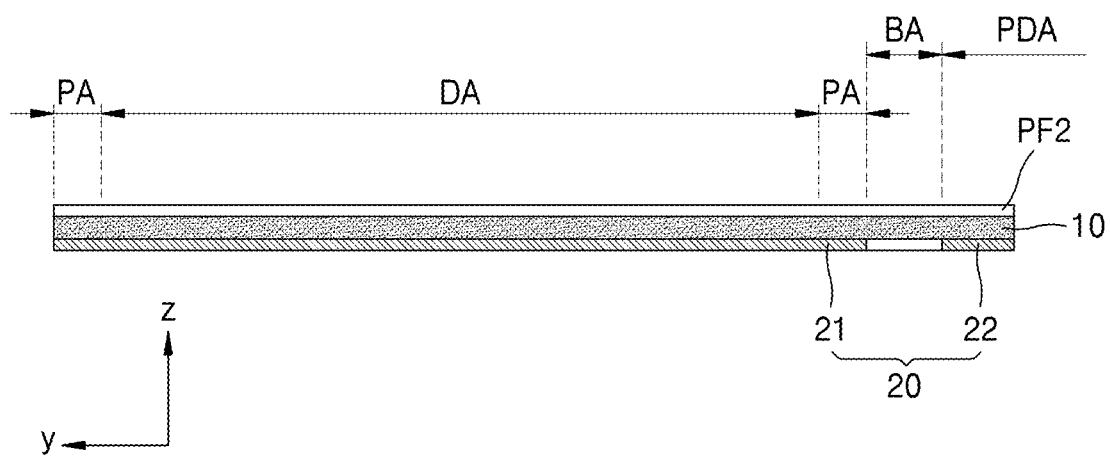

Next, referring to FIG. 9B, the first protection film PF1 attached to the rear surface of the display panel 10 is removed and then the lower protection layer 20 may be attached to the rear surface of the display panel 10. The lower protection layer 20 may be attached to the rear surface of the display panel 10 in the form of a film through an adhesive member. For the adhesive member, a general adhesive known in the art may be employed without limitation. As an example, the adhesive member may be an optically clear adhesive (OCA) or a pressure sensitive adhesive (PSA).

The lower protection layer 20 may protect the display panel 10 from an external impact in the rear surface of the display panel 10. In addition, the lower protection layer 20 may help the display panel 10 to be easily bent in a desired region.

In an embodiment, the lower protection layer 20 may include a first portion 21 and a second portion 22, and the first portion 21 corresponds to the display area DA and the peripheral area PA of the display panel 10, and the second portion 22 corresponds to the pad area PDA of the display panel 10. Here, 'correspond' may mean that elements overlap each other in a view in a direction (e.g., a z-direction) perpendicular to one surface (e.g., the front surface or the rear surface) of the display panel 10 (i.e., in a plan view). The first portion 21 of the lower protection layer 20 may be apart from the second portion 22. As an example, the first portion 21 may be apart from the second portion 22 with the bending area BA therebetween in a plan view. The lower protection layer 20 may be formed by attaching the lower protection layer 20 to the rear surface of the entire display panel 10 and patterning the lower protection layer 20 with a laser. As described above, because the first portion 21 of the lower protection layer 20 is apart from the second portion 22 with the bending area BA therebetween, the display panel 10 may be easily bent in the bending area BA as described below.

Figure 9C:
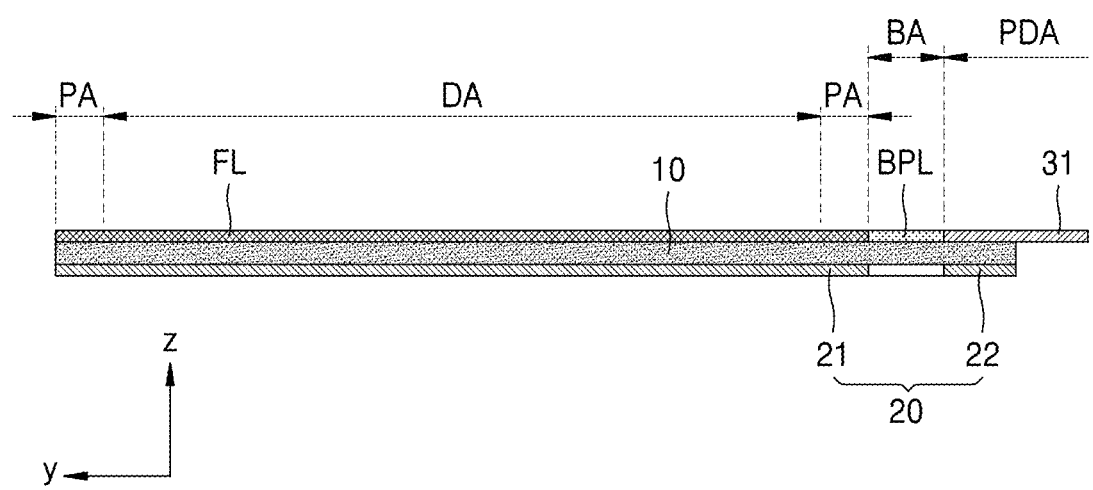

Referring to FIG. 9C, the second protection film PF2 attached on the front surface of the display panel 10 is removed and then the functional layer FL, a bending protection layer BPL, and the display circuit board 31 may be attached to the front surface of the display panel 10. As an example, the lower protection layer 20 is attached to the rear surface of the display panel 10 and then the functional layer FL, the bending protection layer BPL, and the display circuit board 31 may be attached to the display area DA, the bending area BA, and the pad area PDA of the front surface of the display panel 10, respectively.

The functional layer FL, the bending protection layer BPL, and the display circuit board 31 may each be attached to the front surface of the display panel 10 through an adhesive member. The adhesive member may be, for example, an optically clear adhesive (OCA) or a pressure sensitive adhesive (PSA). The functional layer FL has been described above with reference to FIG. 4A and the display circuit board 31 has been described above with reference to FIG. 5, and thus, repeated descriptions thereof are omitted.

The bending protection layer BPL may correspond to the bending area BA of the display panel 10. The bending protection layer BPL may include, for example, a polymer resin such as polyethylene terephthalate (PET) and polyimide (PI).

The bending protection layer BPL may protect the display panel 10 from an external impact in the bending area BA and support the display panel 10 such that the shape of the display panel 10 is in a good state while the display panel 10 is bent.

Figure 9D:
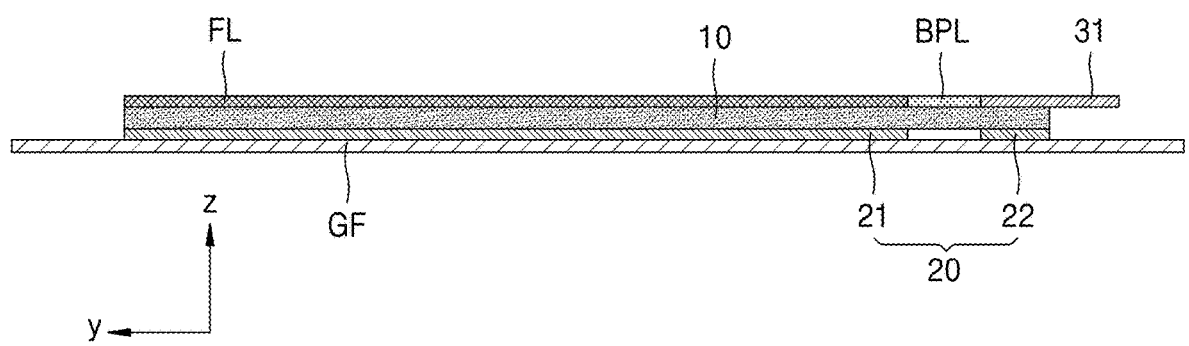

Next, referring to FIG. 9D, a guide film GF may be attached to the rear surface of the lower protection layer 20. Here, the 'rear surface' of the lower protection layer 20 means a surface opposite the surface of the lower protection layer 20 attached to the display panel 10. In FIG. 9D, the rear surface of the lower protection layer 20 may be a surface facing a (−) z-direction (i.e., bottom surface). The guide film GF may be attached to the rear surface of the lower protection layer 20 through an adhesive member. The adhesive member may be, for example, an optically clear adhesive (OCA) or a pressure sensitive adhesive (PSA).

Figure 9E:
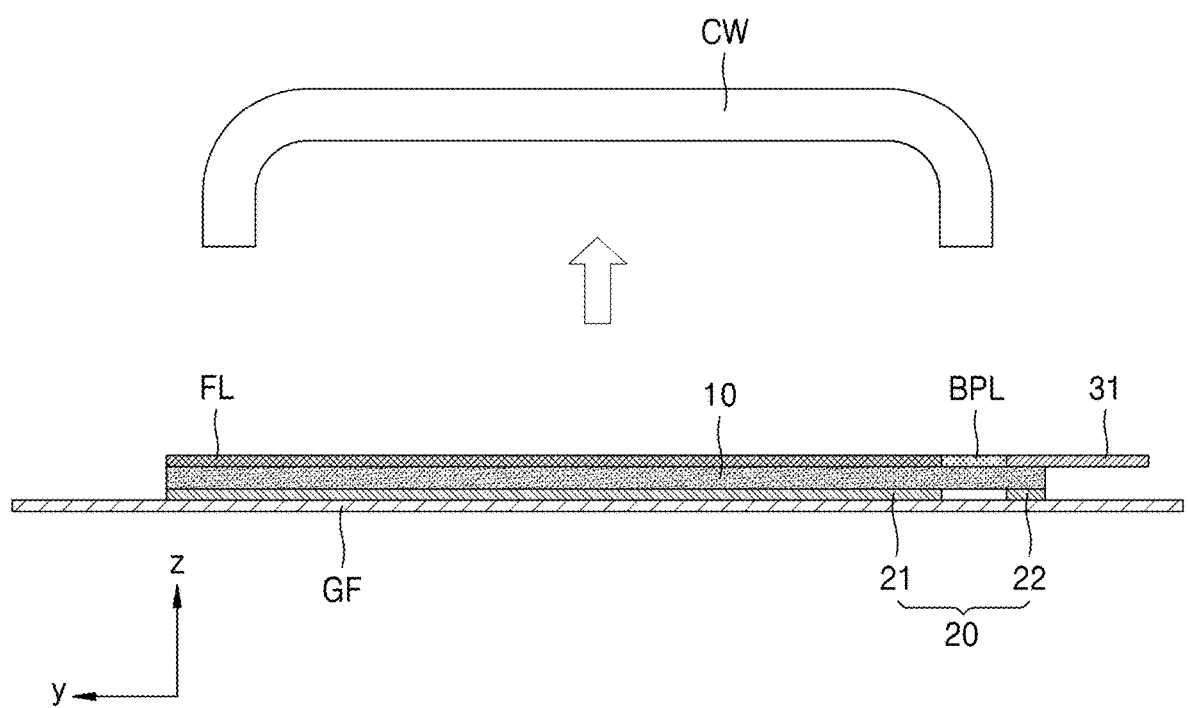

Referring to FIG. 9E, the cover window CW may be prepared. The cover window CW may be attached to the display panel 10. That is, the display panel 10 may be attached to the cover window CW such that the front surface of the display panel 10 faces the cover window CW.

In an embodiment, when the cover window CW is attached to the display panel 10, the guide film GF may be used to improve adhesive quality therebetween. As an example, after the display panel 10 is preliminarily formed by using the guide film GF, the display panel 10 may be attached to the cover window CW. The preliminary forming of the display panel 10 may be achieved by applying tensile force to the guide film GF and transforming the shape of the display panel 10.

The operation of preparing the cover window CW and the operation of preliminarily forming the display panel 10 are described in detail below with reference to FIGS. 11A to 11J.

Figure 9F:
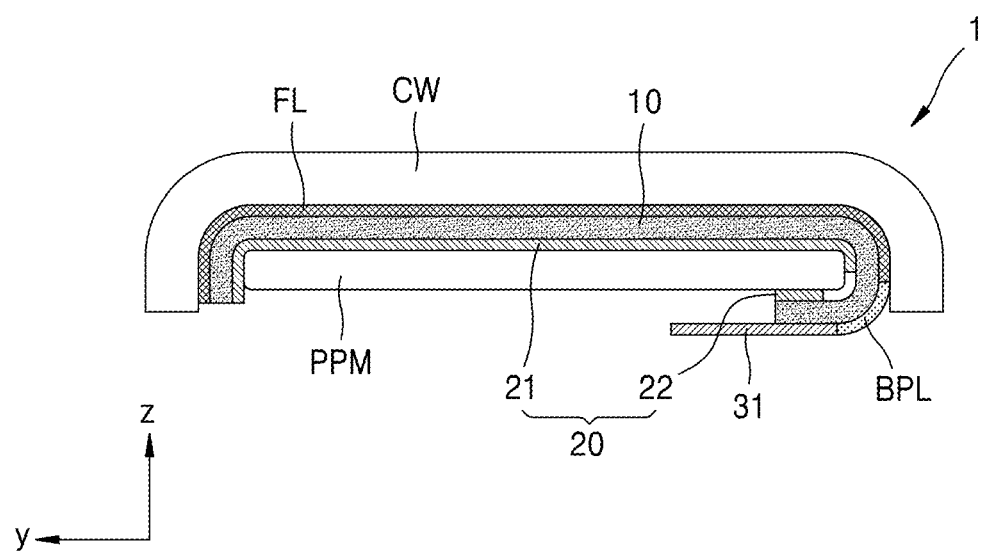

Referring to FIG. 9F, the display panel 10 is attached to the cover window CW and then the guide film GF may be removed. Then, a portion of the display panel 10 may be bent. As an example, the bending area BA of the display panel 10 may be bent such that the display circuit board 31 attached to the display panel 10 overlaps the display panel 10 on the rear surface of the lower protection layer 20 in a plan view. In this case, because the first portion 21 of the lower protection layer 20 is apart from the second portion 22 with the bending area BA therebetween, the display panel 10 may be more easily bent in the bending area BA.

As described above, because the display panel 10 is bent such that the pad area PDA of the display panel 10, which is a portion of the non-display area NDA, overlaps the display area DA of the display panel 10, an area of the non-display area NDA that is viewed from outside may be reduced when the front surface of the display panel 10 is viewed (i.e., in a plan view).

In an embodiment, before a portion of the display panel 10 is bent, a panel protection member PPM may be arranged on the rear surface of the display panel 10. As an example, the panel protection member PPM may be attached to the rear surface of the lower protection layer 20 through an adhesive member. The adhesive member may be, for example, an optically clear adhesive (OCA) or a pressure sensitive adhesive (PSA).

The panel protection member PPM may protect the display panel 10 from external impacts, etc. and discharge heat from the display panel 10 to the outside. As an example, the panel protection member PPM may include at least one of a light-absorbing layer for absorbing light incident from the outside, a cushion layer for absorbing external impacts, and a heat-dissipating layer for efficiently dissipating heat from the display panel 10.

Figure 10:
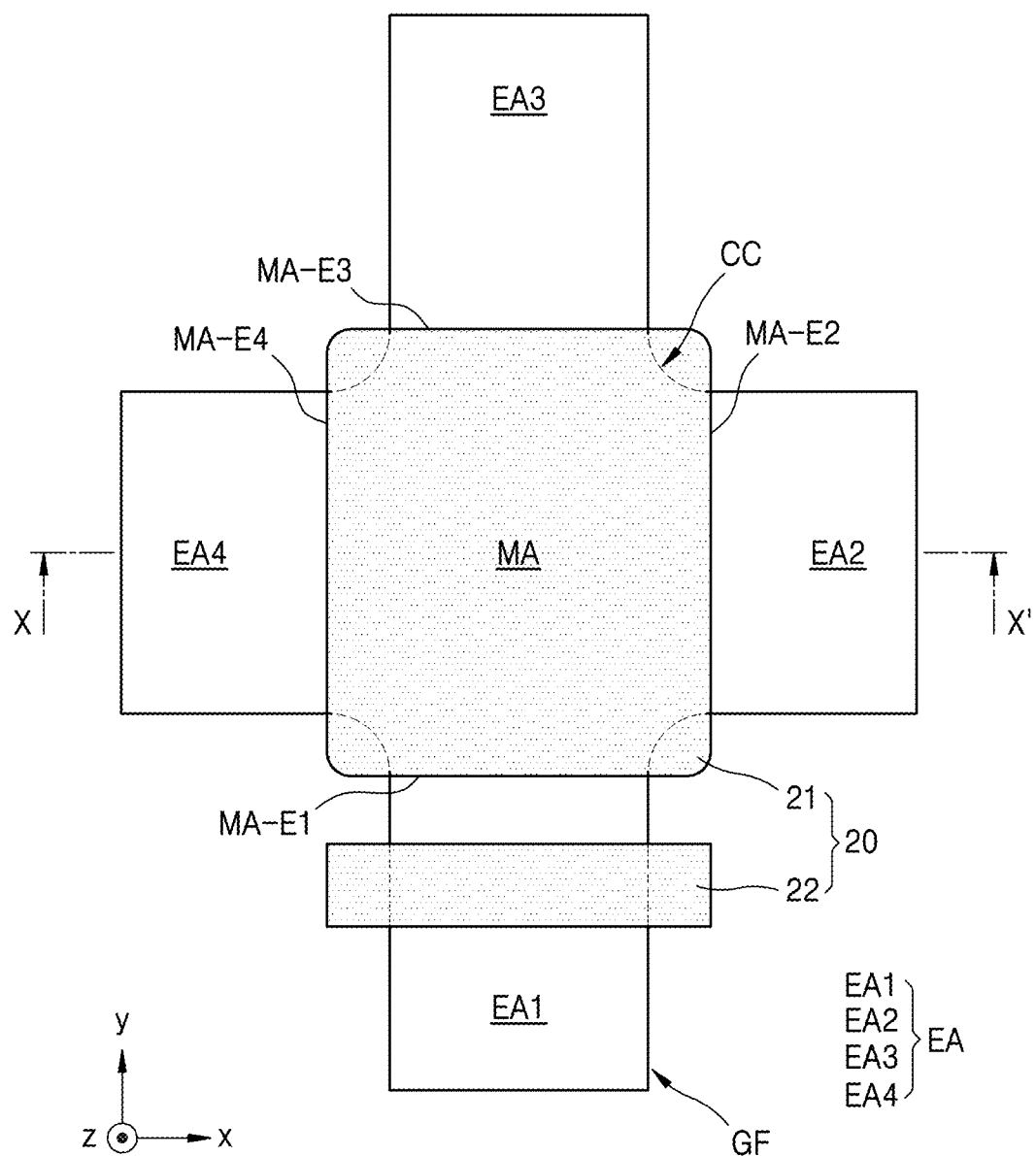
FIG. 10 is a plan view of a guide film and a lower protection layer according to an embodiment.

FIG. 10 is a plan view of a guide film GF and the lower protection layer 20 according to an embodiment. FIG. 10 shows the lower protection layer of the display apparatus and the guide film attached to the rear surface of the lower protection layer configured to preliminary form the display panel.

Referring to FIG. 10, the guide film GF used for manufacturing the display apparatus 1 (see FIG. 2) may include a central area MA and edge areas EA connected to edges of the central area MA, respectively, as an embodiment. As an example, the guide film GF may include a first edge area EA1, a second edge area EA2, a third edge area EA3, and a fourth edge area EA4. The first edge area EA1 is connected to a first edge MA-E1 of the central area MA, the second edge area EA2 is connected to a second edge MA-E2 of the central area MA, the third edge area EA3 is connected to a third edge MA-E3 of the central area MA, and the fourth edge area EA4 is connected to a fourth edge MA-E4 of the central area MA.

Though it is shown in FIG. 10 that the guide film GF includes four edge areas EA, the embodiment according to the invention is not limited thereto, and the guide film GF may include a smaller number of edge areas EA or a greater number of edge areas EA depending on the shape of the display apparatus 1. In addition, though it is shown in FIG. 10 that the edge area EA has a quadrangular shape in a plan view, the edge area EA may have a polygon such as a triangle, a portion of a circle, a portion of an ellipse in another embodiment. However, the edge area EA may have various shapes.

In an embodiment, the guide film GF may be attached to the rear surface of the lower protection layer 20 to overlap the lower protection layer 20 in a plan view. The central area MA of the guide film GF may be attached to overlap the first portion 21 of the lower protection layer 20. At least one edge area EA of the guide film GF may be attached to overlap the second portion 22 of the lower protection layer 20. As an example, the first edge area EA1 of the guide film GF may be attached to overlap the second portion 22 of the lower protection layer 20 in a plan view. Though it is shown in FIG. 10 that the edge of the first portion 21 of the lower protection layer 20 coincides with the edge of the central area MA of the guide film GF, the embodiment according to the invention is not limited thereto.

As described above, the lower protection layer 20 may include the first portion 21 and the second portion 22. The first portion 21 corresponds to the display area DA (see FIG. 5) and the peripheral area PA (see FIG. 5) of the display panel 10 (see FIG. 5), and the second portion 22 corresponds to the pad area PDA (see FIG. 5) of the display panel 10. Specifically, the first portion 21 of the lower protection layer 20 may correspond to the front display area FDA, the side display area SDA, the intermediate display area MDA, and the corner display area CDA of the display panel 10.

The first portion 21 of the lower protection layer 20 may have a shape corresponding to the display area DA and the peripheral area PA of the display panel 10 in a plan view. As an example, the first portion 21 may have, as a whole, a quadrangular shape in which corners are round in a plan view as shown in FIG. 10. The second portion 22 of the lower protection layer 20 may have, as a whole, a quadrangular shape in a plan view. However, the shape according to the invention is not limited thereto.

In an embodiment, the lower protection layer 20 may include the first portion 21 and the second portion 22 including different materials. As an example, the modulus of the first portion 21 of the lower protection layer 20 may be less than the modulus of the second portion 22 of the lower protection layer 20. That is, the first portion 21 of the lower protection layer 20 may include a material having a relatively small modulus, and the second portion 22 of the lower protection layer 20 may include a material having a relatively large modulus.

In an embodiment, as an example, the first portion 21 of the lower protection layer 20 may include poly dimethylsiloxane ("PDMS"). As another example, the first portion 21 of the lower protection layer 20 may include thermoplastic polyurethane ("TPU"). As an example, the modulus of the first portion 21 of the lower protection layer 20 may be greater than 0 megapascals (MPa) and equal to or less than 100 MPa. As an example, the second portion 22 of the lower protection layer 20 may include polyethylene terephthalate (PET). As an example, the modulus of the second portion 22 of the lower protection layer 20 may be about 600 MPa to about 2000 MPa.

The first portion 21 of the lower protection layer 20 may help the corner display area CDA (see FIG. 5) of the display panel 10 to be properly bent while the display panel 10 is preliminarily formed through the guide film GF.

As a comparative example, in the case where the lower protection layer 20 is not provided, even when the side display area SDA (see FIG. 5) of the display panel 10 is properly bent while the display panel 10 is preliminarily formed through the guide film GF, the corner display area CDA of the display panel 10 may be incompletely bent. As another comparative example, even though the lower protection layer 20 corresponding to the display area DA is provided, when the modulus of the lower protection layer 20 is relatively large, the lower protection layer 20 may not be swiftly transformed and large compression stress is formed, and the corner display area CDA of the display panel 10 may be incompletely bent.

With this state, when the display panel 10 is attached to the cover window CW, the corner display area CDA of the display panel 10 that is incompletely bent may be pressed by the corner portion of the cover window CW, and thus, may receive excessive pressure. Accordingly, the corner display area CDA of the display panel 10 may be damaged or buckling or wrinkles may occur. Alternatively, an unexpected space may be formed between the display panel 10 and the cover window CW due to the incomplete bending in the corner display area CDA of the display panel 10. Air bubbles may be trapped in this space.

In contrast, according to an embodiment, the first portion 21 of the lower protection layer 20 may help the corner display area CDA of the display panel 10 to be properly bent, the first portion 21 having a relatively small modulus (exceeding 0 MPa and equal to or less than 100 MPa) and corresponding to the display area DA of the display panel 10. Accordingly, the incomplete bending of the corner display area CDA of the display panel 10 may be effectively prevented or reduced.

The second portion 22 of the lower protection layer 20 may help the display circuit board 31 (see FIG. 5) and/or the display driver 32 (see FIG. 5) to be properly mounted or attached in the pad area PDA. While the display circuit board 31 and/or the display driver 32 are mounted or attached, a preset pressure is applied to the display panel 10. In this case, when the lower protection layer 20 arranged in the pad area PDA has a relatively small modulus, a defect probability may be increased due to repulsive force against the pressure. In contrast, according to an embodiment, the second portion 22 of the lower protection layer 20 that corresponds to the pad area PDA of the display panel 10 may have a relatively large modulus, reduce repulsive force in the pad area PDA and help the display circuit board 31 and/or the display driver 32 to be properly mounted or attached while the display circuit board 31 and/or the display driver 32 are mounted or attached.

In an embodiment, the guide film GF may have a modulus greater than the modulus of the first portion 21 of the lower protection layer 20. As an example, the guide film GF may include polyethylene terephthalate (PET), and the modulus of the guide film GF may be about 600 MPa to about 2000 MPa.

As a comparative example, in the case where the guide film GF includes poly dimethylsiloxane (PDMS) like the first portion 21 of the lower protection layer 20, the thickness of the guide film GF increases due to the relatively small modulus of the guide film GF. Due to this, the display panel 10 may become uneven while the display panel 10 is preliminarily formed. In addition, because poly dimethylsiloxane (PDMS) includes silicon (Si), the guide film GF may stick to the stage of equipment transferring the guide film GF.

In contrast, to resolve this issue, in an embodiment, the guide film GF may include a material having a relatively large modulus, for example, include polyethylene terephthalate (PET).

In an embodiment, with the guide film GF attached on the rear surface of the lower protection layer 20, the intermediate area MA of the guide film GF may include a concave corner CC not to overlap the corner display area CDA of the display panel 10 in a plan view. That is, as shown in FIG. 5, before the display panel 10 is bent, the corner display area CDA of the display panel 10 may overlap the lower protection layer 20 and may not overlap the guide film GF in a plan view. Through this, even when the guide film GF includes a material having a relatively large modulus, it may be avoided for the guide film GF to adversely influence the bending of the corner display area CDA of the display panel 10.

FIGS. 11A to 11J are side views or perspective views showing a method of manufacturing a display apparatus according to an embodiment and mainly show an operation of preparing the cover window CW and an operation of preliminarily forming the display panel 10.

Figure 11A:
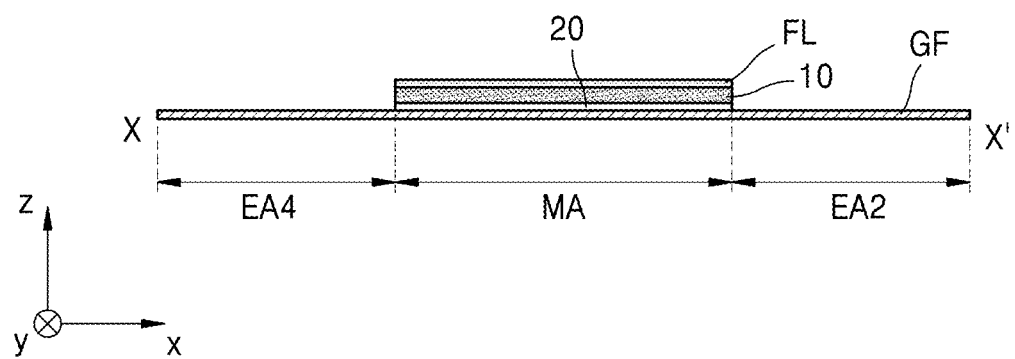
FIGS. 11A to 11J are side views or perspective views showing a method of manufacturing a display apparatus according to an embodiment.

Referring to FIG. 11A, the display panel 10, the functional layer FL on the display panel 10, and the lower protection layer 20 attached on the rear surface of the display panel 10 are prepared. The guide film FL may be attached to the rear surface of the lower protection layer 20.

In an embodiment, when the guide film GF is attached to the rear surface of the lower protection layer 20, the guide film GF may be attached such that the display panel 10 corresponds to the central area MA of the guide film GF. Specifically, the guide film GF may be attached such that all of the front display area FDA, the side display area SDA, the intermediate display area MDA, and the corner display area CDA correspond to the central area MA of the guide film GF. In this case, the edge areas EA (see FIG. 10) of the guide film GF may not overlap the display panel 10 in a plan view.

Figure 11B:
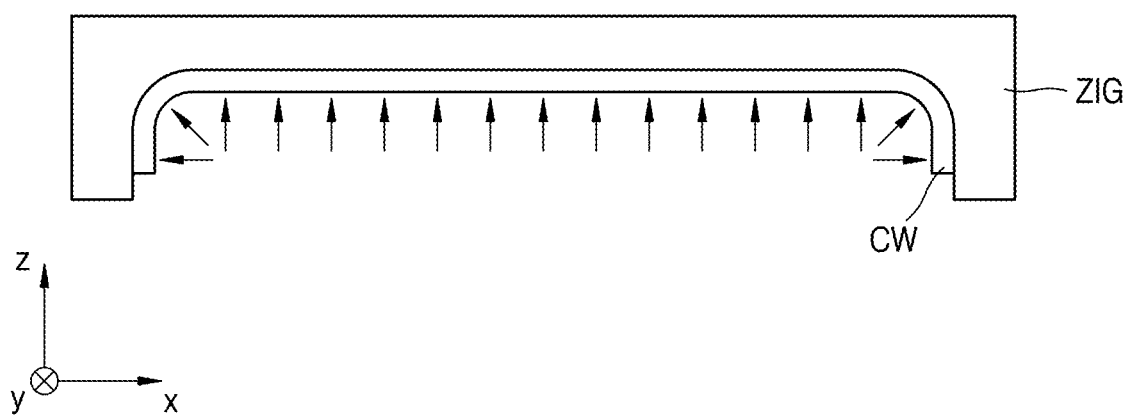

Referring to FIG. 11B, to prepare the cover window CW, the cover window CW may be transformed to have planes and curves by using a zig ZIG including a concave surface corresponding to the final shape of the cover window CW. That is, the zig ZIG may be a frame having the shape of the display apparatus to be finally manufactured. The cover window CW may be transformed according to the shape of the concave surface of the zig ZIG by closely attaching the cover window CW to the concave surface of the zig ZIG.

Figure 11C:
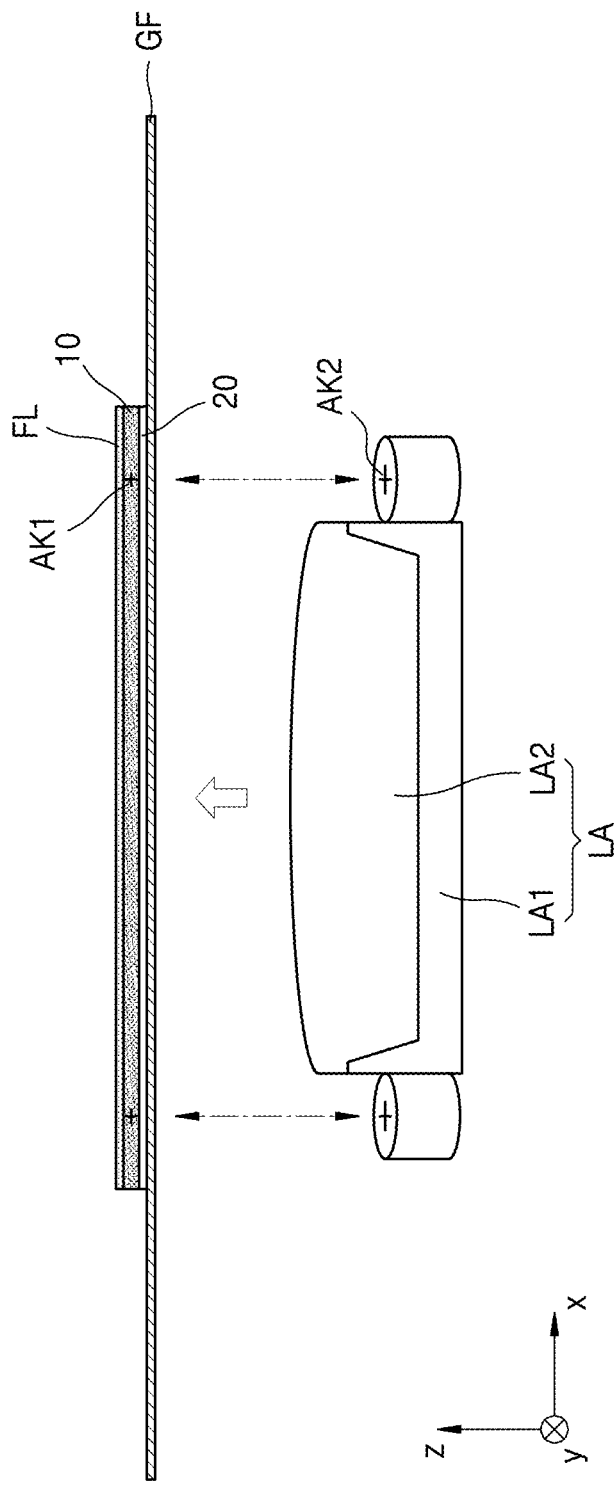

Referring to FIG. 11C, a lamination apparatus LA may be prepared, the lamination apparatus LA including a support LA1 and a volume change portion LA2 on the support LA1. The support LA1 may support the volume change portion LA2. The volume change portion LA2 may include an air pump or be connected to the air pump. Because the volume change portion LA2 has a small modulus, the shape and the volume of the volume change portion LA2 is variable according to an air pressure through the air pump. Alternatively, the volume change portion LA2 may include a diagram.

The rear surface of the display panel 10 may be arranged to face the lamination apparatus LA. That is, the guide film GF may be arranged on the side of the lamination apparatus LA. Next, the display panel 10 may be aligned with the lamination apparatus LA. As an example, the display panel 10 may be aligned with the lamination apparatus LA such that a first alignment key AK1 marked on the display panel 10 coincides with a second alignment key AK2 marked on the lamination apparatus LA.

Figure 11D:
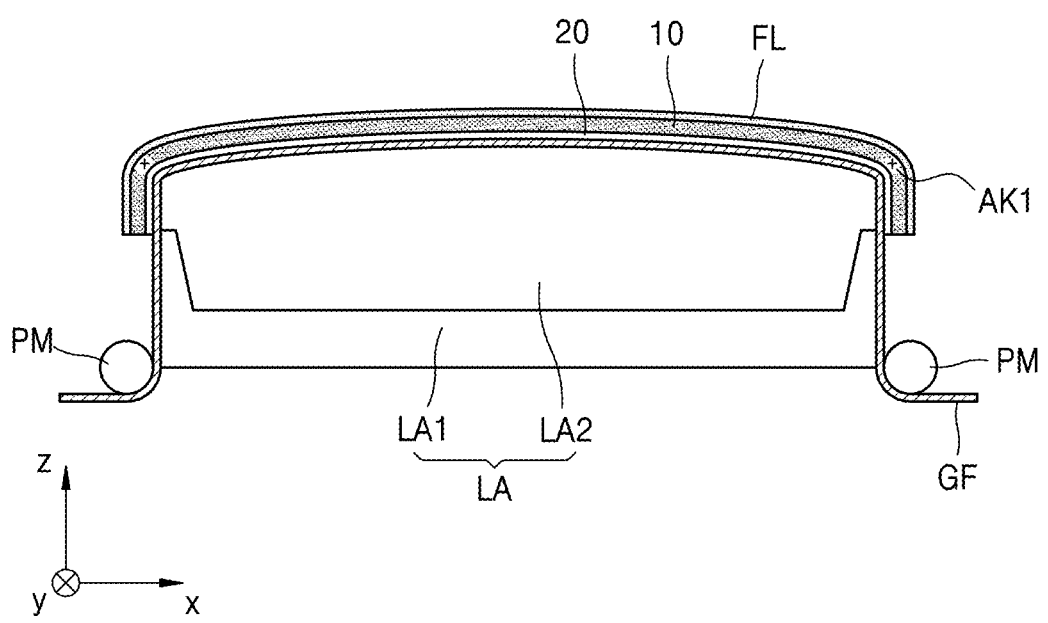

Referring to FIG. 11D, the display panel 10 may be preliminarily formed through the guide film GF. As an example, the shape of the display panel 10 may be transformed by applying external force, for example, tensile force to the guide film GF.

Specifically, the guide film GF may be seated on the lamination apparatus LA. A push member PM may be arranged on the guide film GF. The guide film GF may be closely attached to the lateral side of the lamination apparatus LA by using the push member PM. As an example, because push members PM press the edge areas EA of the guide film GF, respectively, tensile force may be applied to the guide film GF. As the guide film GF is transformed along the outer surface of the lamination apparatus LA, the display panel 10 on the guide film GF may be appropriately bent and transformed.

Figure 11E:
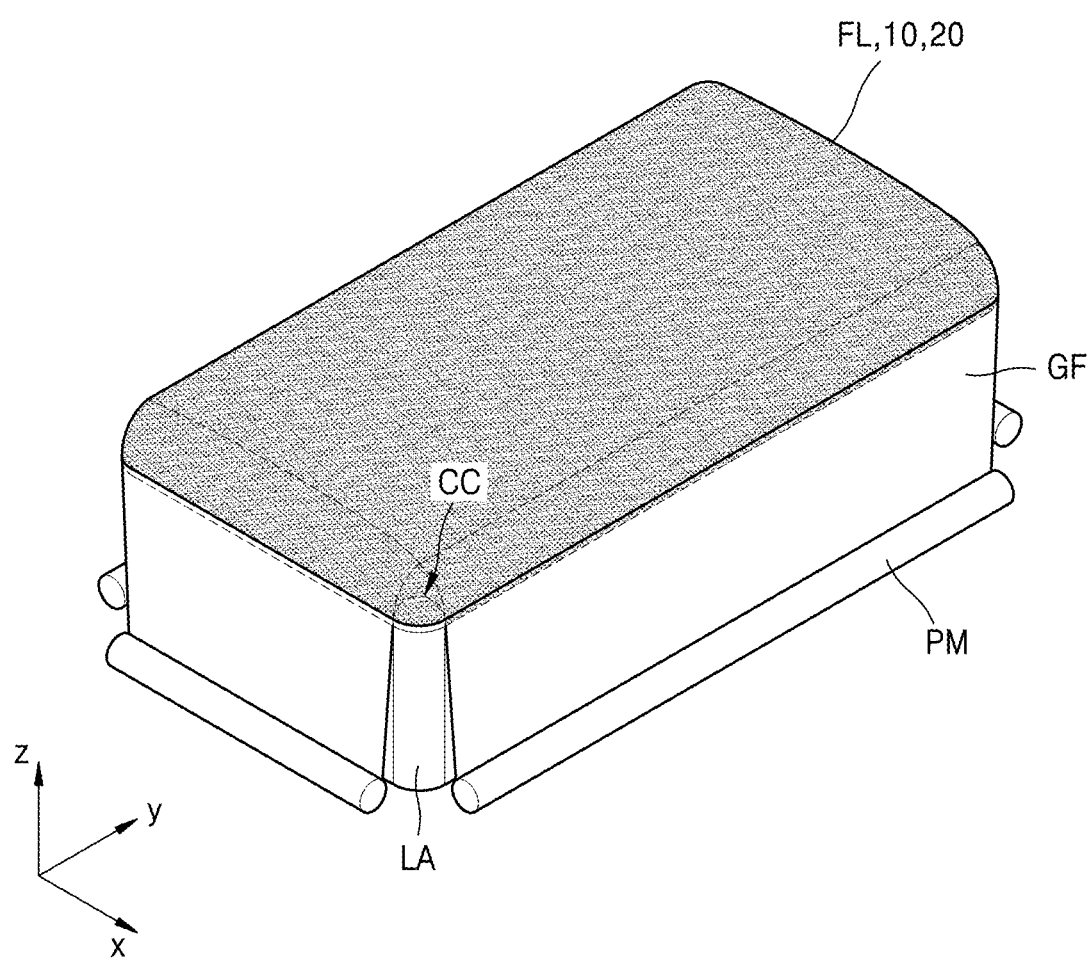

Referring to FIG. 11E, the shape of the display panel 10 that is preliminarily formed through the guide film GF may be shown.

Figure 11F:
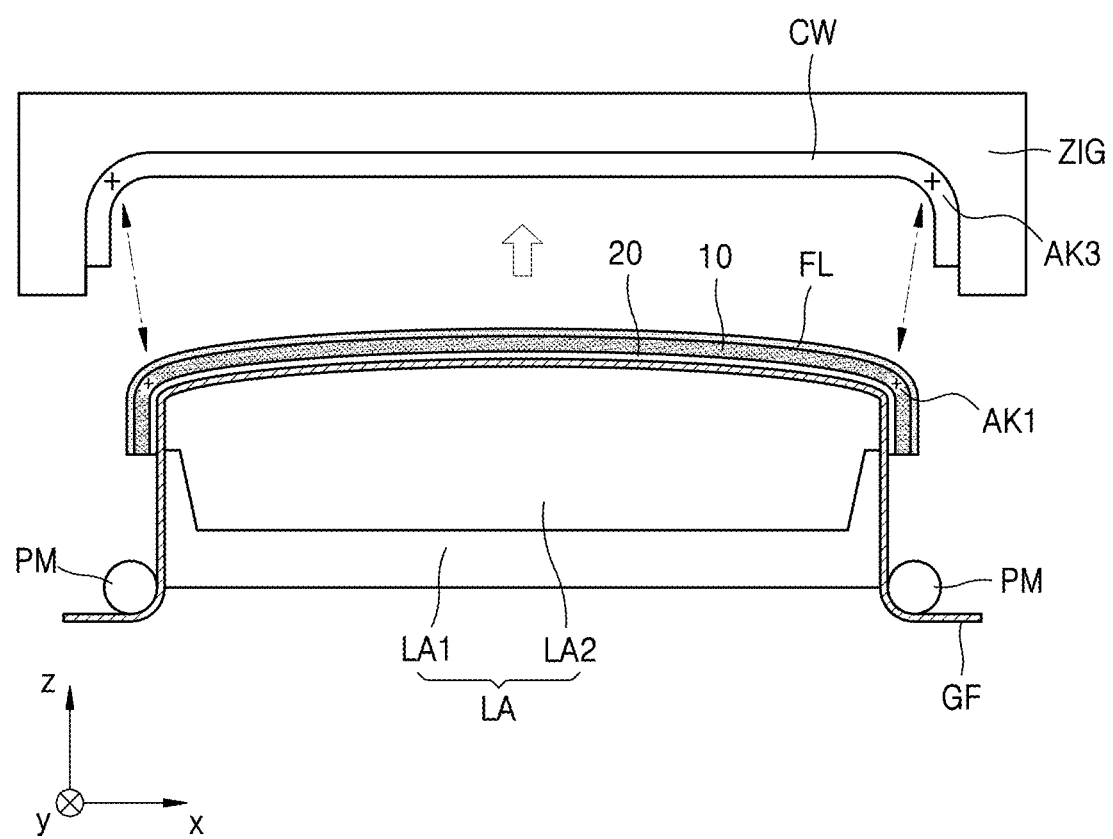

Referring to FIG. 11F, after the display panel 10 is preliminarily formed, the front surface of the display panel 10 is arranged to face the cover window CW, and the display panel 10 may be aligned with the cover window CW. The display panel 10 may be aligned with the cover window CW such that the first alignment key AK1 marked on the display panel 10 coincides with a third alignment key AK3 marked on the cover window CW.

Figure 11G:
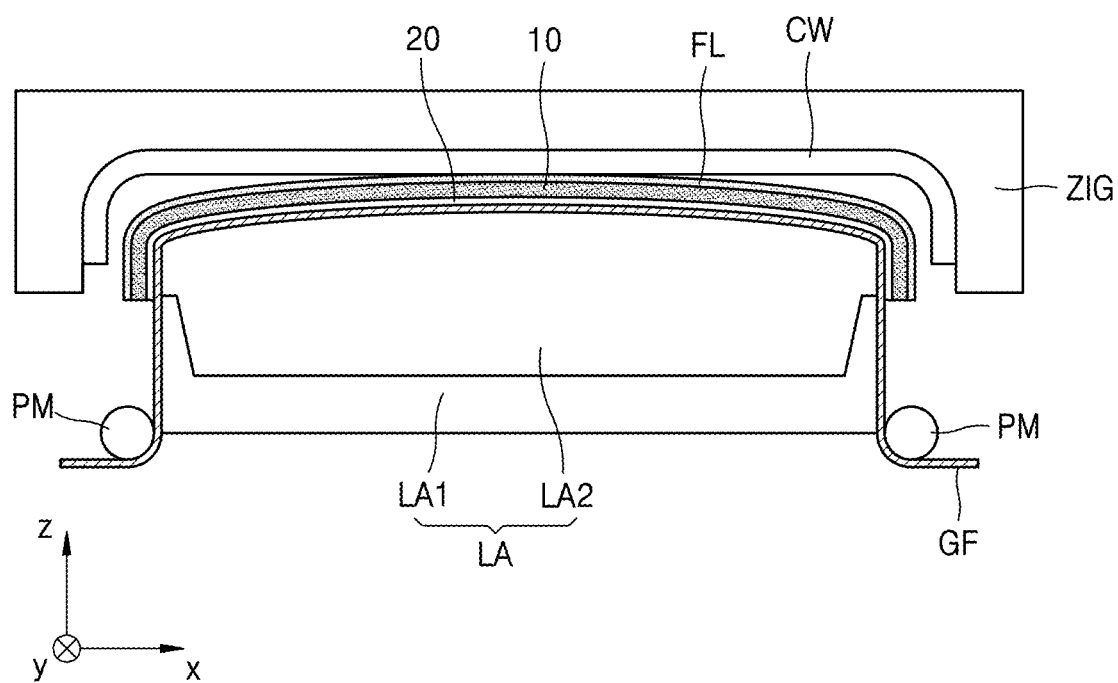
Figure 11H:
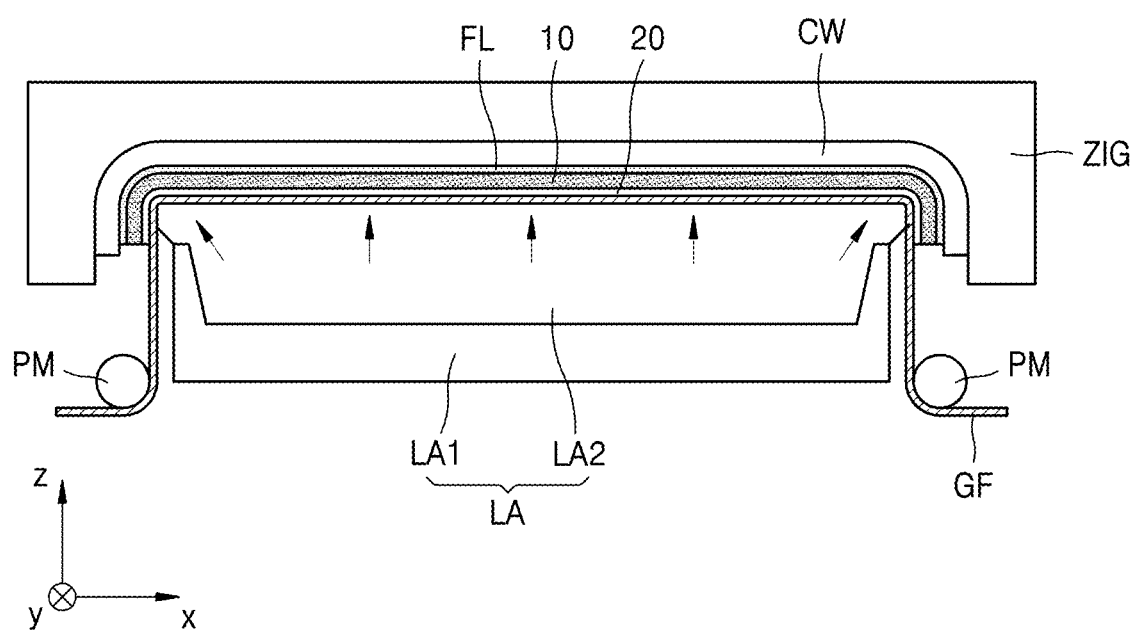

Referring to FIGS. 11G and 11H, the cover window CW may be attached on the front surface of the display panel 10. As an example, as shown in FIG. 11G, first, a portion of the display panel 10 may be attached on the cover window CW. A flat surface (e.g., the front display area FDA) having no curvature in the final shape of the display panel 10 may be attached on the cover window CW on the first place.

Next, as shown in FIG. 11H, as the shape of the volume change portion LA2 of the lamination apparatus LA changes and the volume thereof increases, the rest of portions of the display panel 10, for example, the side display area SDA and the corner display area CDA may be attached to the cover window CW.

An operation of attaching the side display area SDA to the cover window CW and an operation of attaching the corner display area CDA to the cover window CW may be simultaneously performed. As an example, while the side display area SDA is attached to the cover window CW, the corner display area CDA may naturally contact and stick to the cover window CW due to peripheral external force. As another example, an operation of attaching the side display area SDA to the cover window CW and an operation of attaching the corner display area CDA to the cover window CW may be performed at different times. As an example, the side display area SDA may be attached to the cover window CW first, and then the corner display area CDA may be attached to the cover window CW.

Figure 11I:
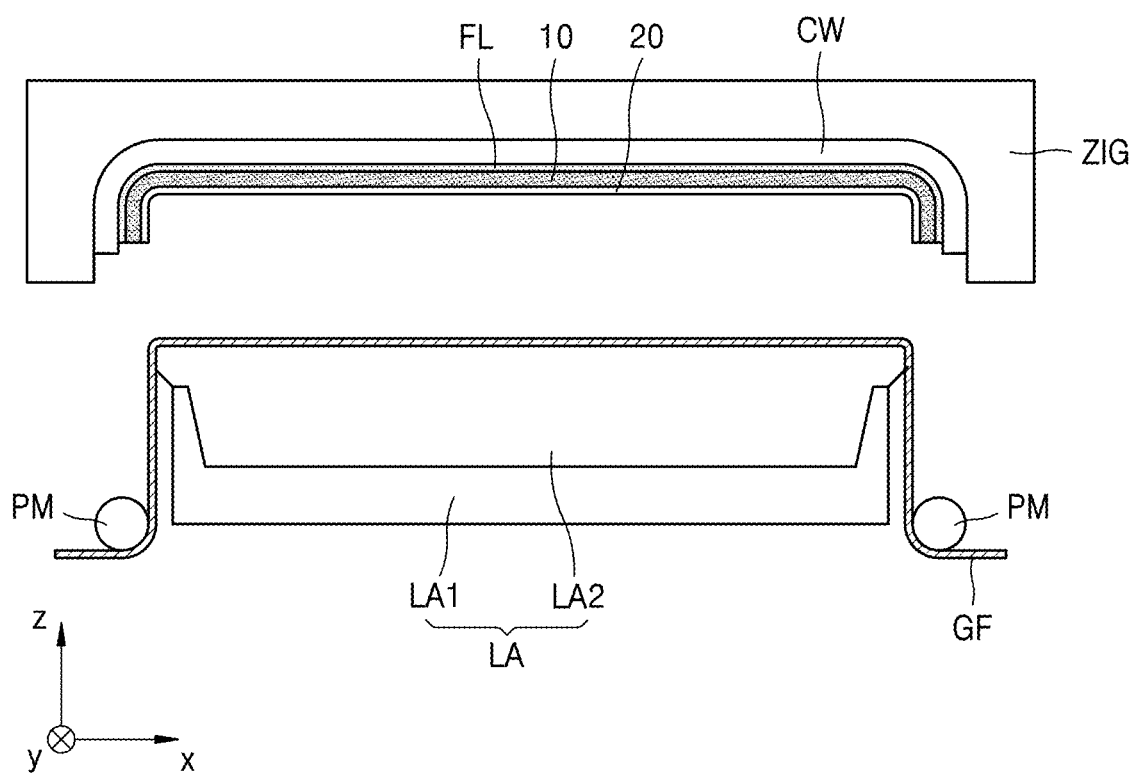

Referring to FIG. 11i, after an operation of attaching the display panel 10 to the cover window CW is performed, the guide film GF may be removed from the display panel 10 to which the cover window CW has been attached. As an example, the guide film GF may be separated from the display panel 10 by irradiating ultraviolet ("UV") to an adhesive member (not shown) that attaches the guide film GF to the display panel 10 and weakening adhesive force of the adhesive member.

Figure 11J:
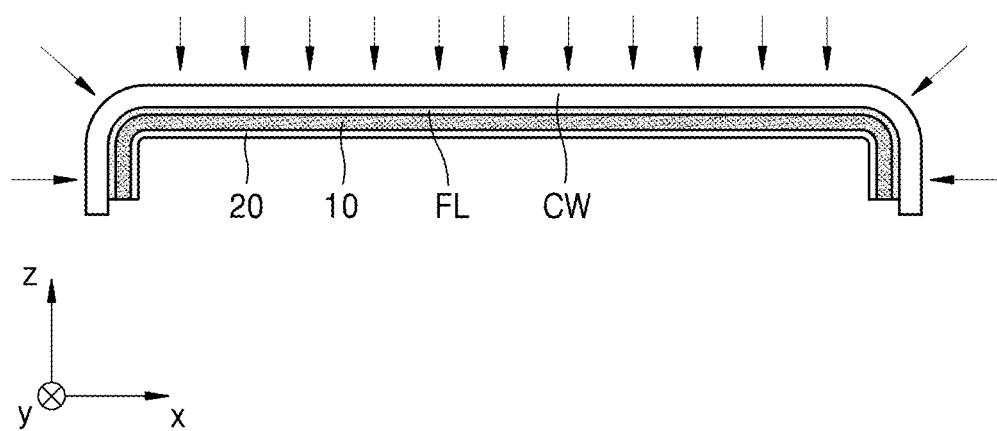

Referring to FIG. 11J, an operation of hardening the cover window CW and the display panel 10 may be performed. As an example, the hardening may be performed by irradiating UV to the cover window CW and the display panel 10. When UV is irradiated to the cover window CW and the display panel 10, air bubbles, etc. may escape from the adhesive member, etc. attached to the display panel 10.

Though the contents disclosed with reference to FIGS. 3 to 11J up to this point have been disclosed as an example of the display apparatus 1 of FIG. 2, the above descriptions are equally applicable to the display apparatus 1 of FIG. 1. In this case, the disclosure regarding the corner display area CDA of the display apparatus 1 of FIG. 2 is applicable to the corner area CA of the display apparatus 1 of FIG. 1.

According to an embodiment, the display apparatus which may display an image even on a lateral surface and/or a corner to reduce the area of the non-display area and increase the area of the display area, and a manufacturing method thereof may be implemented. In addition, when the display panel is attached to the cover window while the display apparatus is manufactured, damage to the corner portion of the display panel may be effectively prevented or reduced, or bucking, wrinkles, etc. may be effectively prevented from occurring. Through this, quality and yields may be effectively improved. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display apparatus comprising:
   a display panel including a display area, a peripheral area being outside the display area, a bending area being on one side of the peripheral area, and a pad area being spaced apart from the peripheral area with the bending area therebetween; and
   a lower protection layer arranged on a rear surface of the display panel and including a first portion and a second portion, wherein the first portion corresponds to the display area and the peripheral area, and the second portion corresponds to the pad area,
   wherein the first portion of the lower protection layer includes a material different from a material of the second portion.

2. The display apparatus of claim 1, wherein a modulus of the first portion of the lower protection layer is less than a modulus of the second portion.

3. The display apparatus of claim 1, wherein the first portion of the lower protection layer includes poly dimethylsiloxane.

4. The display apparatus of claim 1, wherein the first portion of the lower protection layer includes thermoplastic polyurethane.

5. The display apparatus of claim 1, wherein a modulus of the first portion of the lower protection layer is greater than about 0 megapascals (MPa) and less than about 100 MPa.

6. The display apparatus of claim 1, wherein the second portion of the lower protection layer includes polyethylene terephthalate.

7. The display apparatus of claim 1, further comprising a display circuit board attached in the pad area of the display panel.

8. The display apparatus of claim 1, wherein the display panel is bent in the bending area such that the display area overlaps the pad area in a thickness direction of the display panel.

9. The display apparatus of claim 1, further comprising a cover window arranged on a front surface of the display panel.

10. The display apparatus of claim 1, wherein the display area of the display panel includes:
    a flat front display area;
    a first side display area adjacent to a first edge of the front display area, wherein at least a portion of the first side display area is bent; and
    a second side display area adjacent to a second edge of the front display area crossing the first edge, wherein at least a portion of the second side display area is bent, and
    the peripheral area of the display panel includes a corner area arranged at a corner side where the first edge meets the second edge of the front display area, and the corner area is adjacent to the first side display area and the second side display area.

11. The display apparatus of claim 1, wherein the display area of the display panel further includes:
    a flat front display area;
    a first side display area adjacent to a first edge of the front display area, wherein at least a portion of the first side display area is bent;
    a second side display area adjacent to a second edge of the front display area crossing the first edge, wherein at least a portion of the second side display area is bent; and
    a corner display area arranged at a corner side where the first edge meets the second edge of the front display area, and
    the corner display area is adjacent to the first side display area and the second side display area.

* * * * *